United States Patent [19]

Henke

[11] Patent Number: 5,027,089

[45] Date of Patent: Jun. 25, 1991

[54] HIGH FREQUENCY NOISE BYPASSING

[75] Inventor: Reinhold Henke, St. Paul, Minn.

[73] Assignee: ADC Telecommunications, Inc., Minneapolis, Minn.

[21] Appl. No.: 247,350

[22] Filed: Sep. 21, 1988

Related U.S. Application Data

[62] Division of Ser. No. 204,751, Jun. 10, 1988.

[51] Int. Cl.$^5$ .............................................. H04B 3/28
[52] U.S. Cl. .................................... 333/12; 333/181; 361/414
[58] Field of Search ................. 333/12, 181, 185, 246, 333/247; 361/397, 400, 404, 412, 414, 415, 424; 174/68.5, 260

[56] References Cited

U.S. PATENT DOCUMENTS 3,916,514 11/1975 Salminen ......................... 361/414 X
4,267,528 5/1981 Thornberry .......................... 333/12
4,353,047 10/1982 Noguchi et al. ................... 333/247
4,384,331 5/1983 Fukuhara et al. ................ 333/12 X
4,710,854 12/1987 Yamada et al. ..................... 361/414
4,751,613 6/1988 Werdin et al. .................. 361/415 X
4,758,805 7/1988 Yamazaki et al. .................... 333/12

Primary Examiner—Eugene R. Laroche
Assistant Examiner—Seung Ham
Attorney, Agent, or Firm—Merchant, Gould, Smith, Edell, Welter & Schmidt

[57] ABSTRACT

Apparatus and method for bypassing high frequency noise from a component mounted to a circuit board provides that the component be connected to the power and signal ground planes of the PC board with respective signal traces and that bypass capacitors be connected between these signal traces between the component and the signal and ground planes.

10 Claims, 20 Drawing Sheets

|  | VCC +5 VDC | VEE −5 VDC | +12 +12 VDC | −48 −48 VDC | ⏚ 5V RETURN | ▽ ANALOG GND | ▽ 12V RETURN | ▼ −48V RETURN | ⏚ CHASSIS GND |
|---|---|---|---|---|---|---|---|---|---|
| UA3 | 4 | 1 |  |  |  | 2 |  |  |  |
| UA4 | 4 | 1 |  |  |  | 2 |  |  |  |
| UA6 | 4 | 1 |  |  |  | 2 |  |  |  |
| UA7 | 4 | 1 |  |  |  | 2 |  |  |  |
| UC3 | 16 |  |  |  | 8 |  |  |  |  |
| UE2 | 14 |  |  |  | 7 |  |  |  |  |
| UC4 | 16 |  |  |  | 8 |  |  |  |  |
| UD6 | 14 |  |  |  | 7 |  |  |  |  |
| UC6 | 14 |  |  |  | 7 |  |  |  |  |
| UA1 | 14 |  |  |  | 7 |  |  |  |  |
| UC1 | 14 |  |  |  | 7 |  |  |  |  |
| UE3 | 14 |  |  |  | 7 |  |  |  |  |
| UB5 | 16 |  |  |  | 8 |  |  |  |  |
| UB7 | 14 |  |  |  | 7 |  |  |  |  |
| UB4 | 16 |  |  |  | 8 |  |  |  |  |
| UD4 | 14 |  |  |  | 7 |  |  |  |  |
| UB2 | 14 |  |  |  | 7 |  |  |  |  |
| UC2 | 16 |  |  |  | 8 |  |  |  |  |
| UB1 | 16 |  |  |  | 8 |  |  |  |  |
| UB3 | 14 |  |  |  | 7 |  |  |  |  |
| UD1 |  |  |  |  |  |  |  |  |  |
| UA5 | 14 |  |  |  | 7 |  |  |  |  |
| UF1 |  |  |  |  | 8 |  |  |  |  |
| UE1 | 20 |  |  |  | 10 |  |  |  |  |
| UC1 | 14 |  |  |  | 7 |  |  |  |  |
| UD5 | 16 |  |  |  | 8 |  |  |  |  |
| UA2 | 16 |  |  |  | 8 |  |  |  |  |
| UB6 | 16 |  |  |  | 8 |  |  |  |  |
| UD3 |  |  |  |  |  |  |  |  |  |
| UD2 |  |  |  |  |  |  |  |  |  |
| UE1 |  |  |  |  |  |  |  |  |  |
| UF2 |  |  |  |  |  |  |  |  |  |
| UF3 | 14 |  |  |  | 7 |  |  |  |  |

FIG. 12A(1)

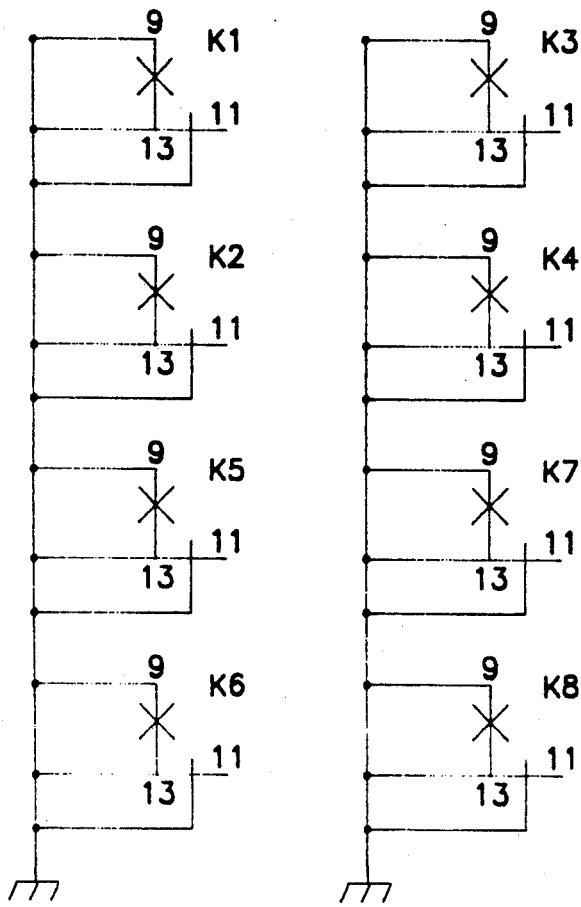

| | |
|---|---|
| CTS | CLEAR TO SEND |
| SR | SIGNALLING BIT RECEIVE |
| SX | SIGNALLING BIT TRANSMIT |
| FSR | FRAM SYNCH RECEIVE |
| FSX | FRAME SYNCH TRANSMIT |
| MCLKX | MASTER CLOCK TRANSMIT |
| BCLKX | BIT CLOCK TRANSMIT |
| MCLKR | MASTER CLOCK RECEIVE |
| BCLKR | BIT CLOCK RECEIVE |
| DR RAIL | DATA RECEIVE RAIL |
| DX RAIL | DATA TRANSMIT RAIL |
| PDN | POWER DOWN |
| TSLP | TRANSMIT SIGNALLING LATCH PULSE |
| FXMIT | FRAME TRANSMIT |
| FREC | FRAME RECEIVE |
| RST | RESET |
| NVM | NON-VALID MANCHESTER |
| RD | RECEIVE DATA |
| MCLK | MASTER CLOCK |

NOTE:
1. UNLESS UNTHERWISE NOTED
   A. ALL RESISTORS ARE IN OHMS, 1/8W, MF, 1%
   B. ALL CAPACITORS ARE IN MFD/VDC

FIG. 12A(2)

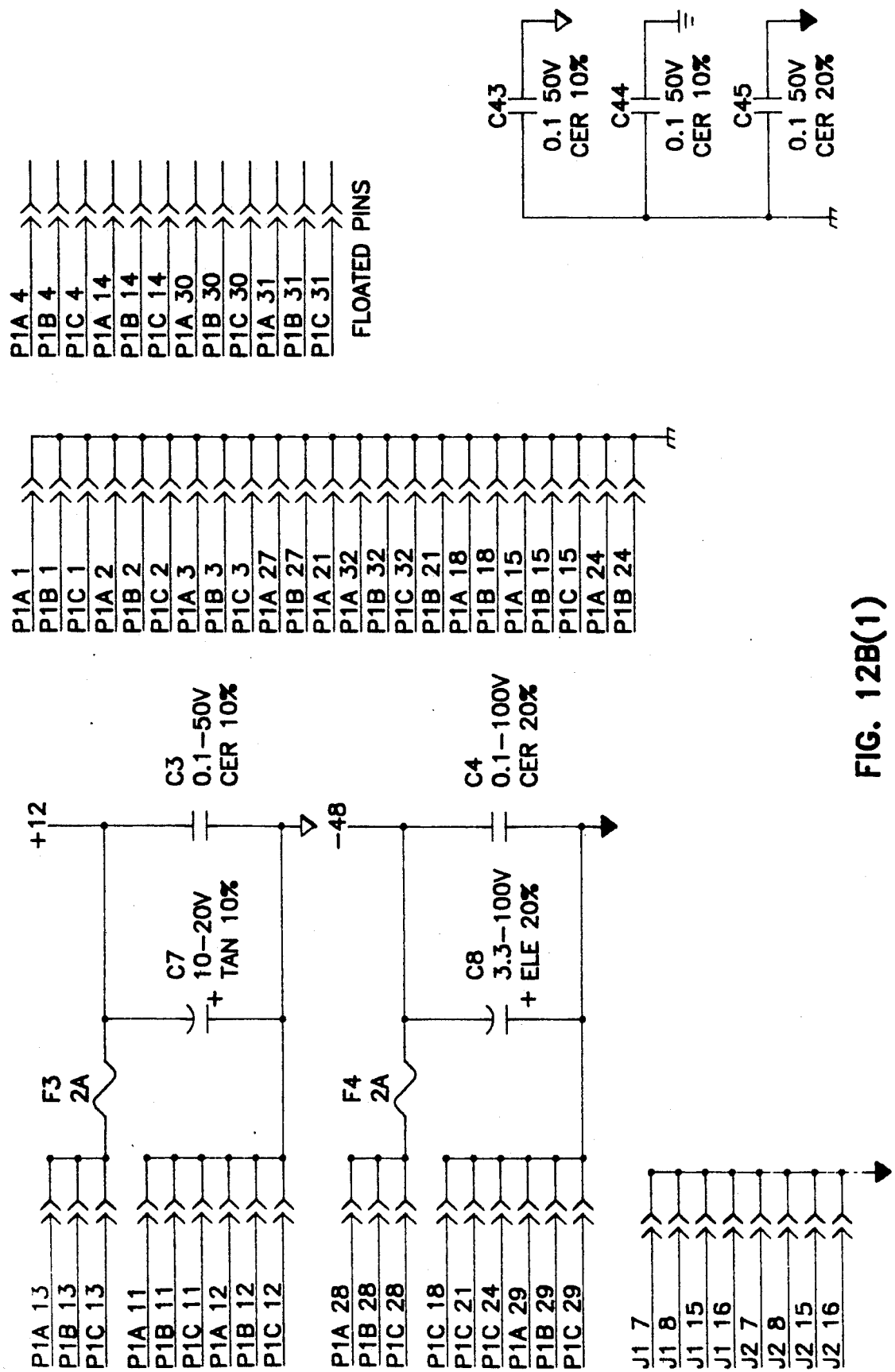
FIG. 12B(1)

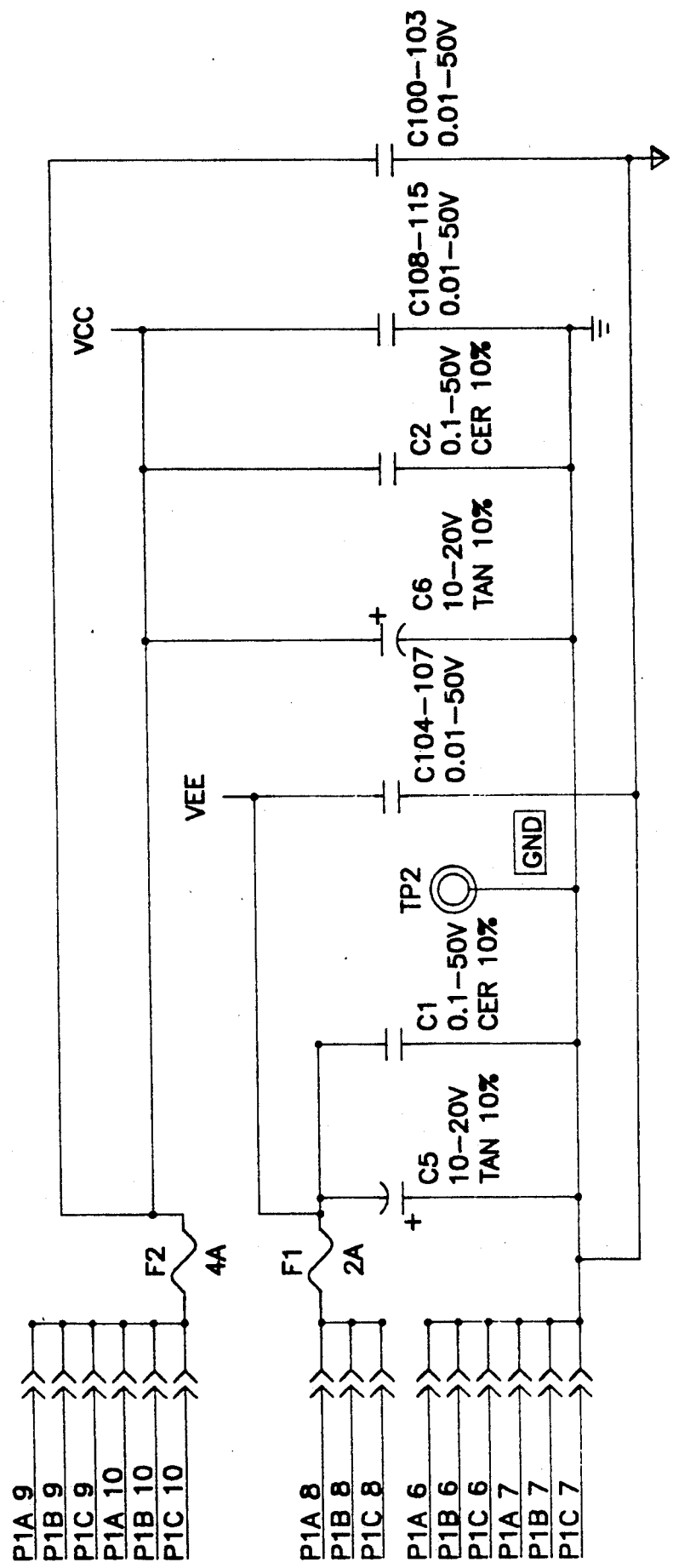
FIG. 12B(2)

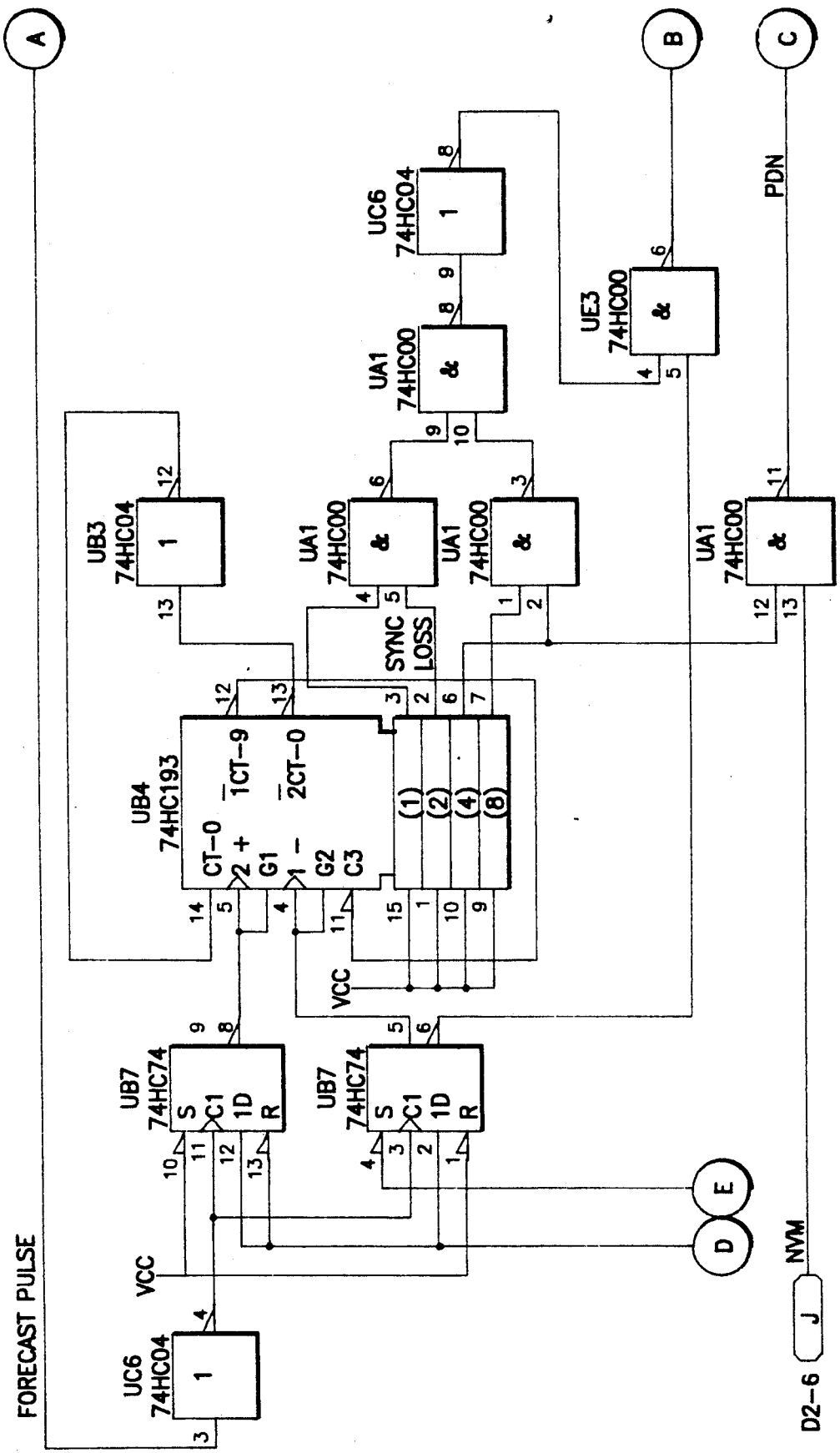
FIG. 12C(1)

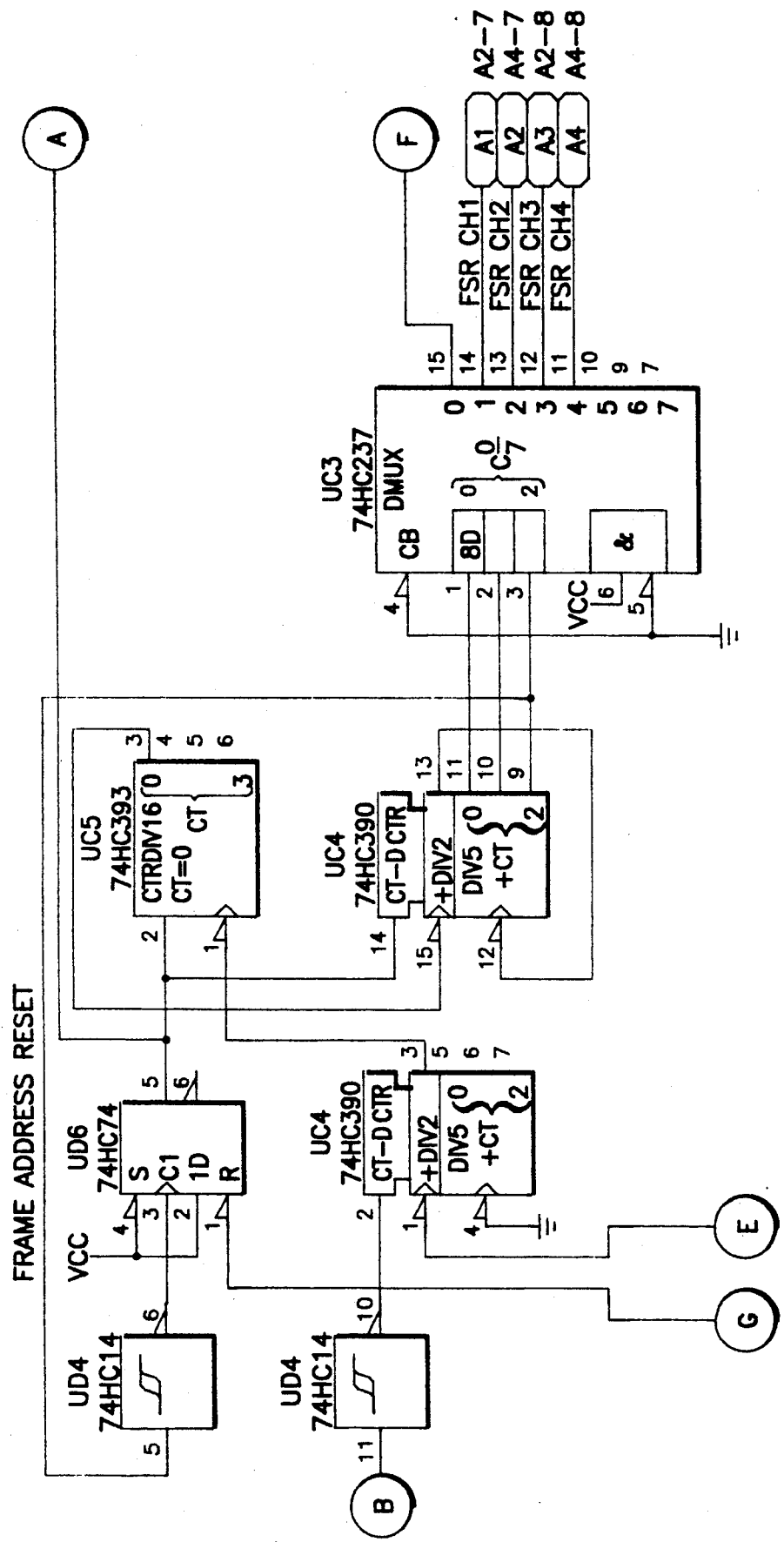
FIG. 12C(2)

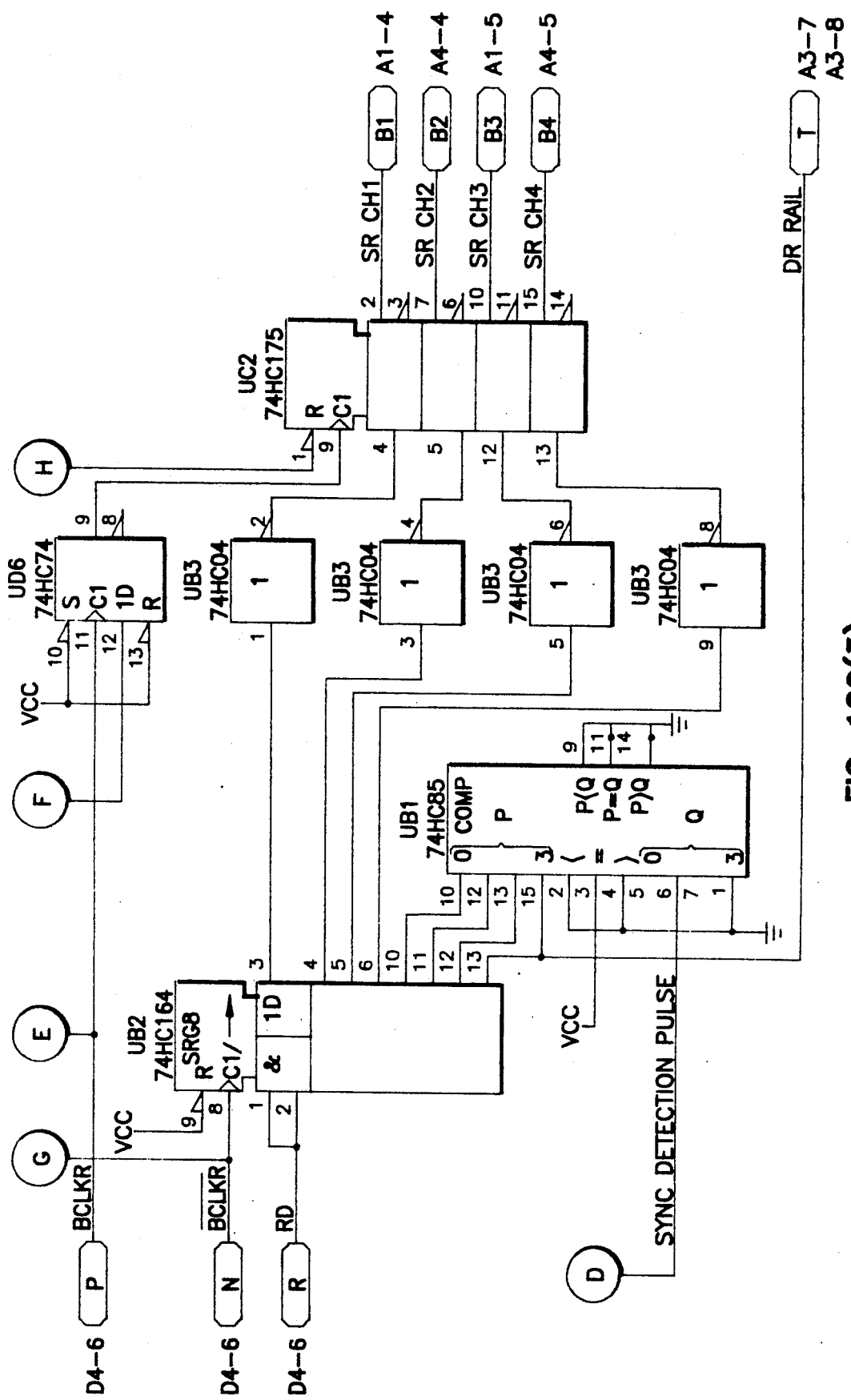
FIG. 12C(3)

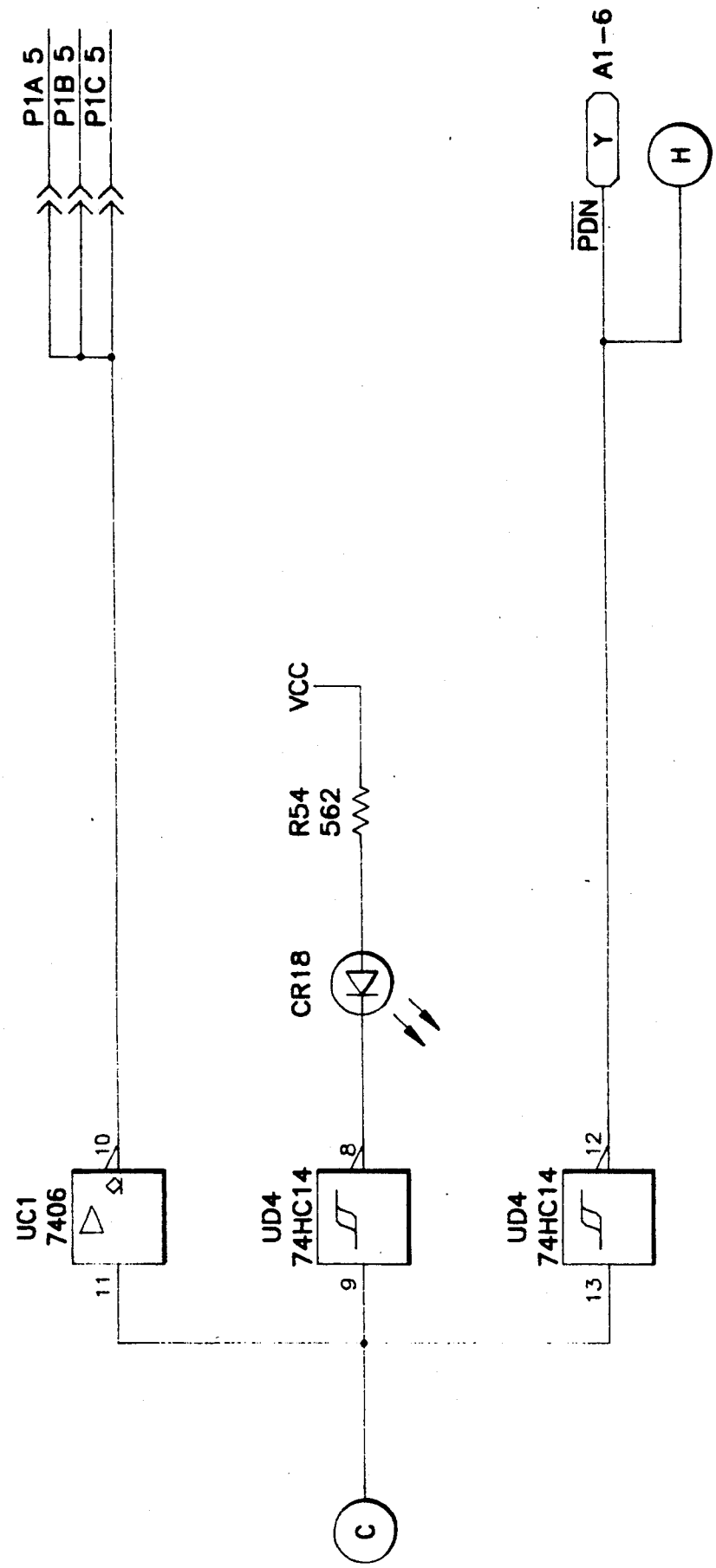
FIG. 12C(4)

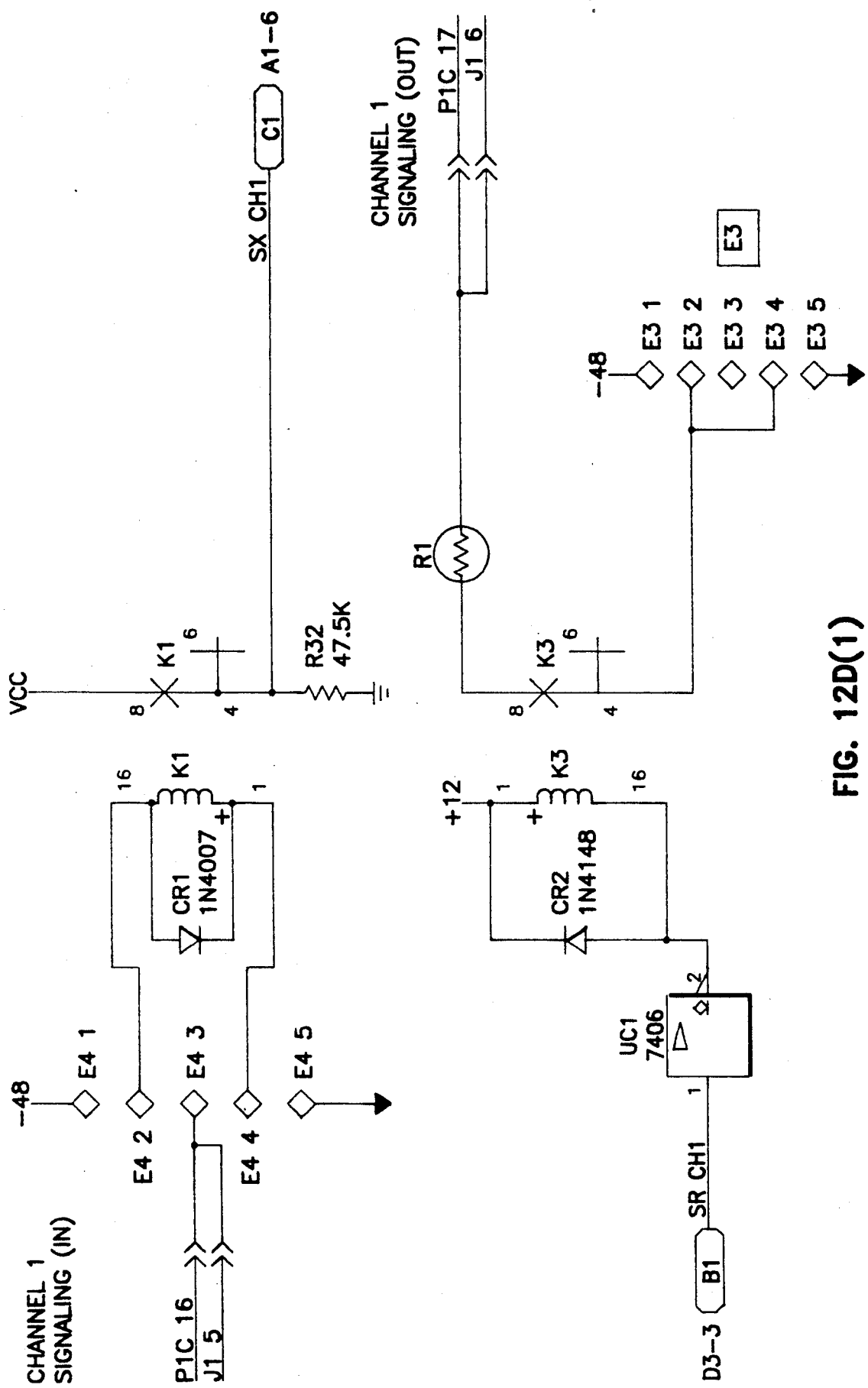
FIG. 12D(1)

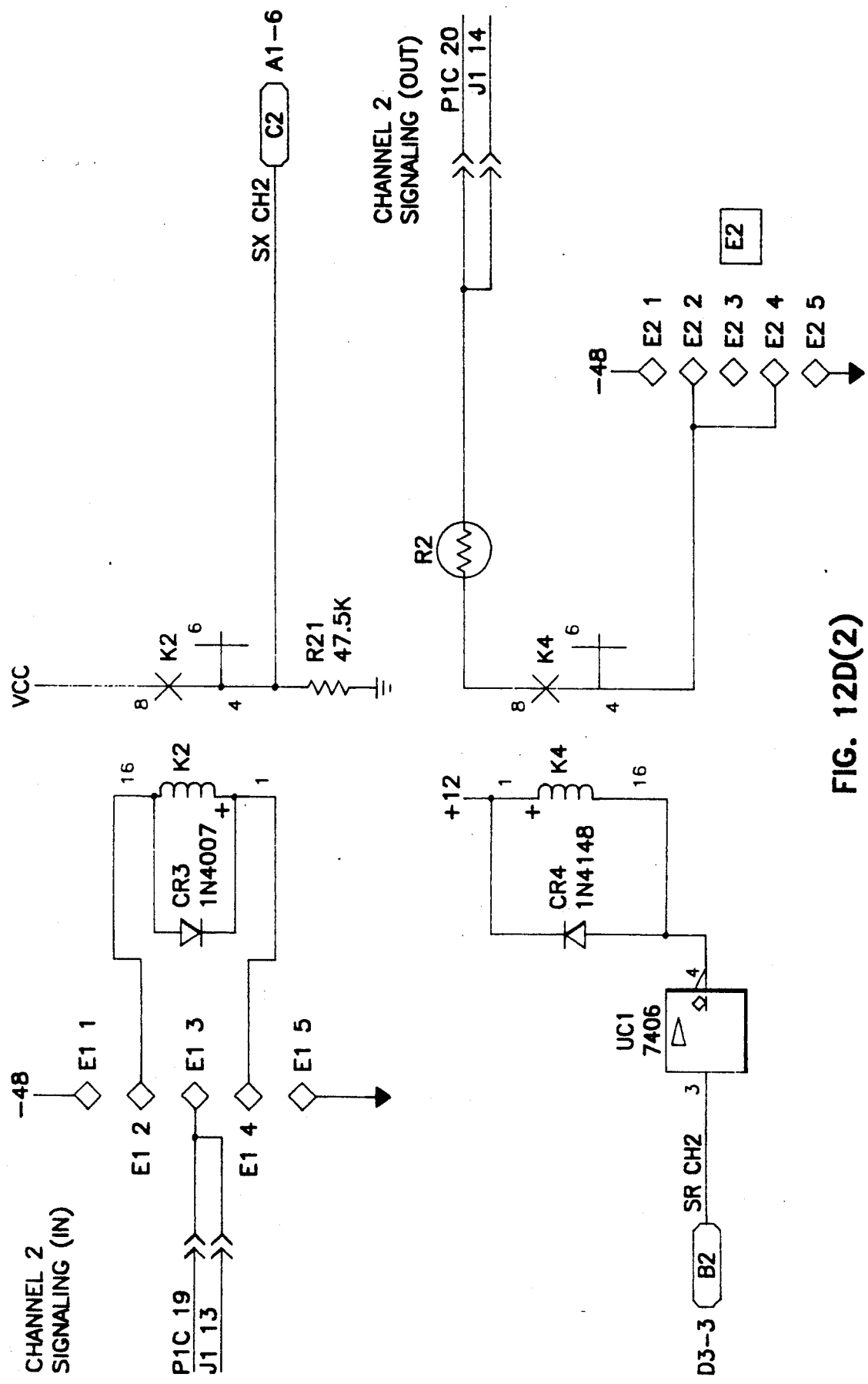
FIG. 12D(2)

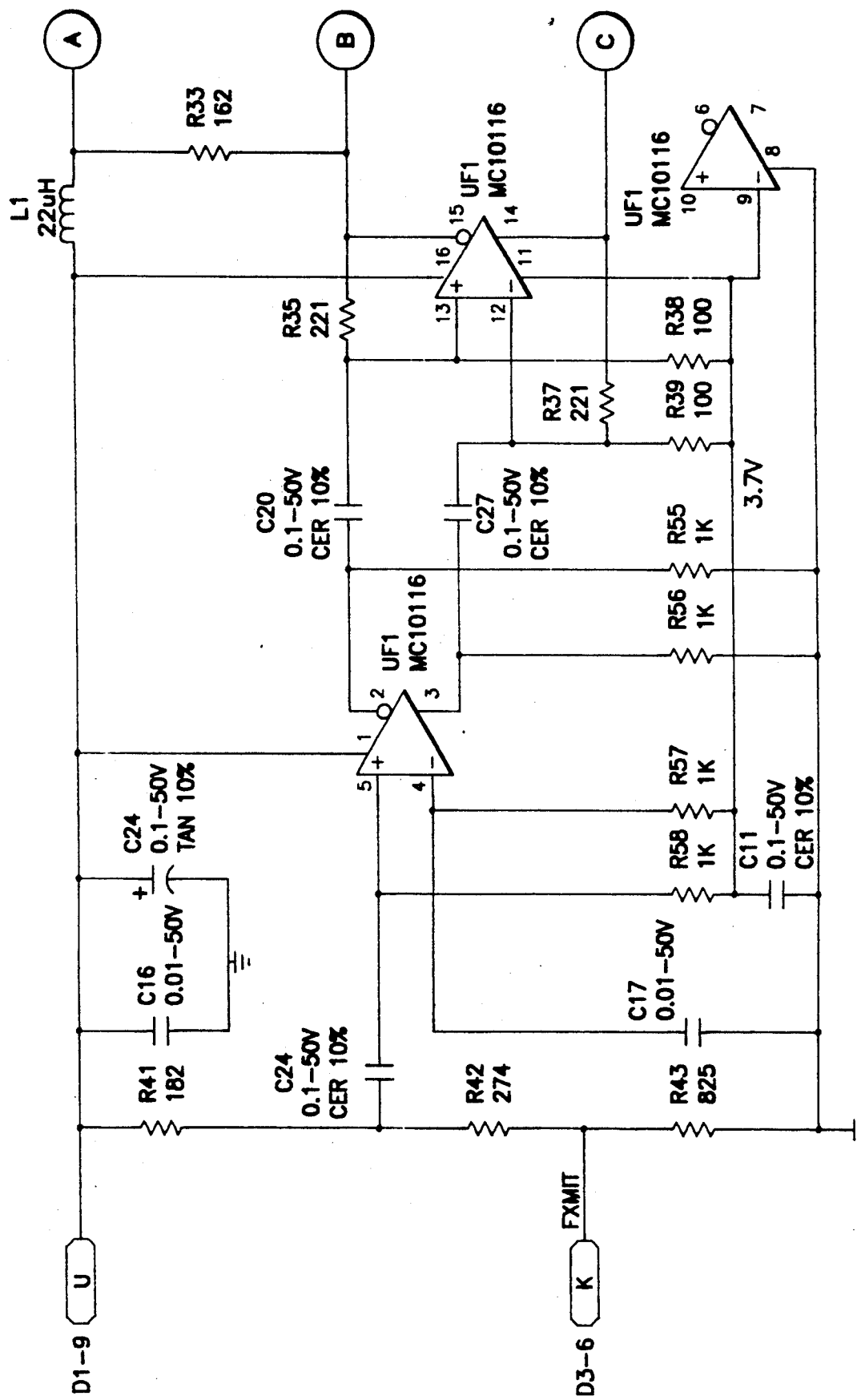
FIG. 12E(1)

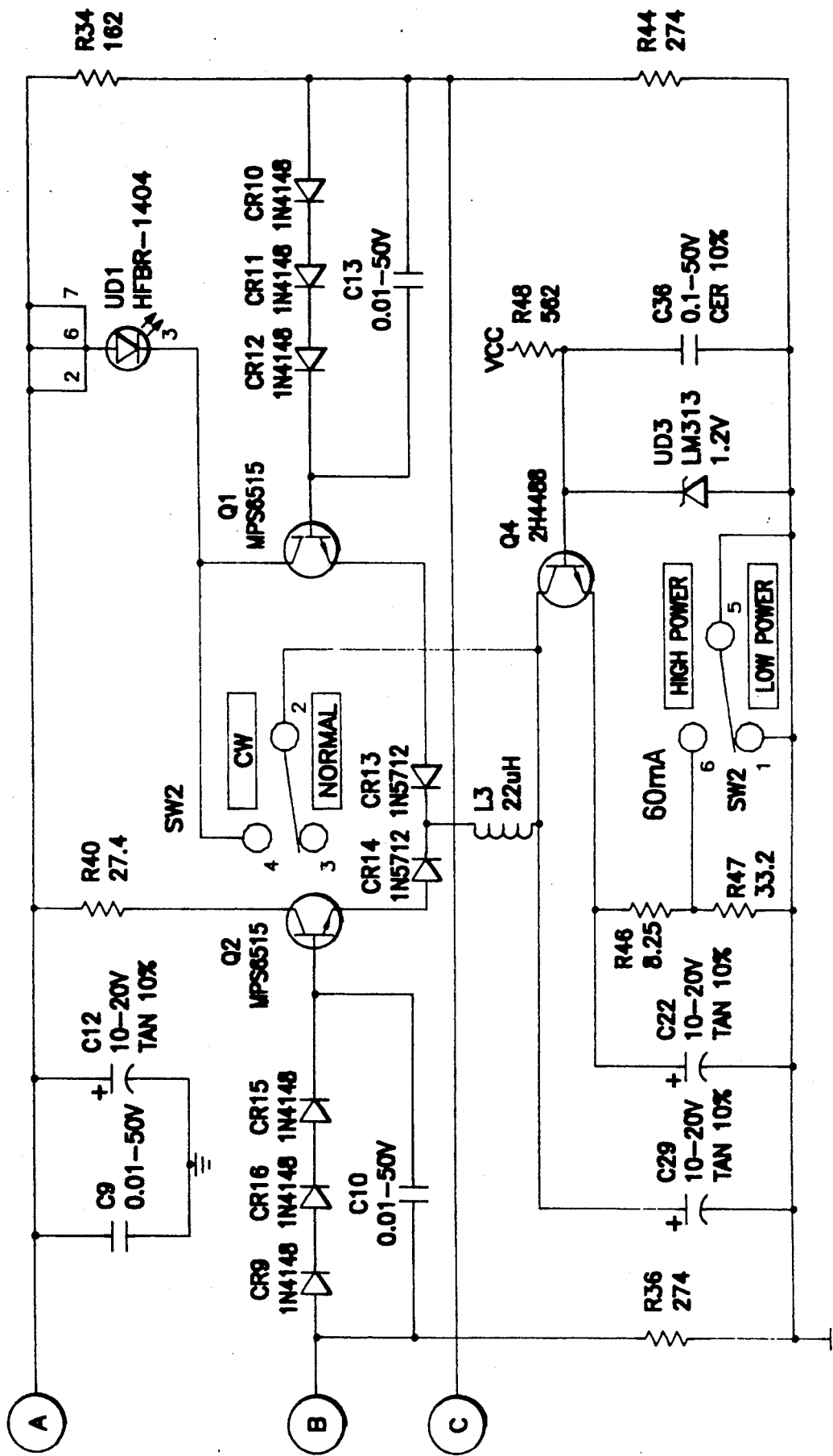
FIG. 12E(2)

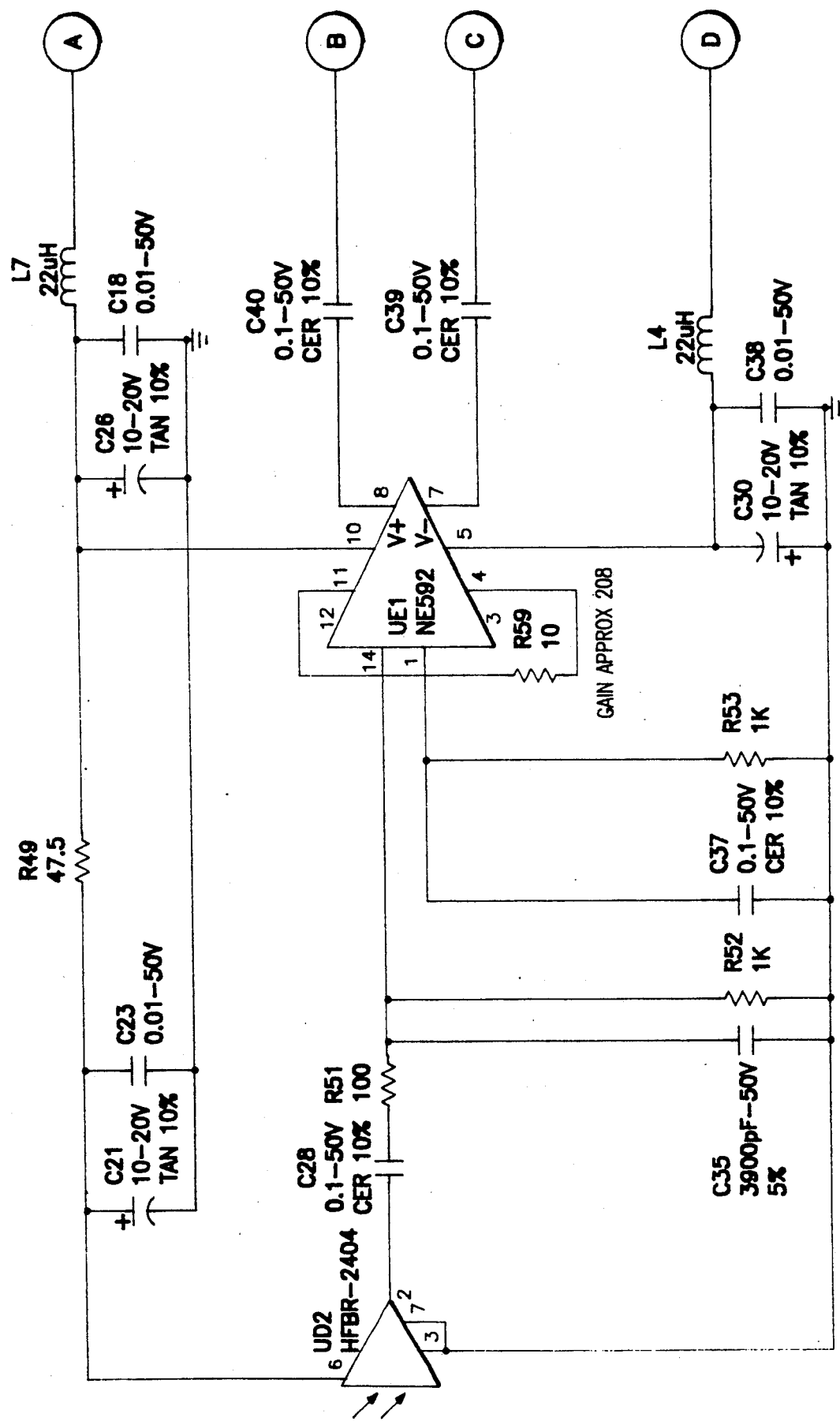
FIG. 12F(1)

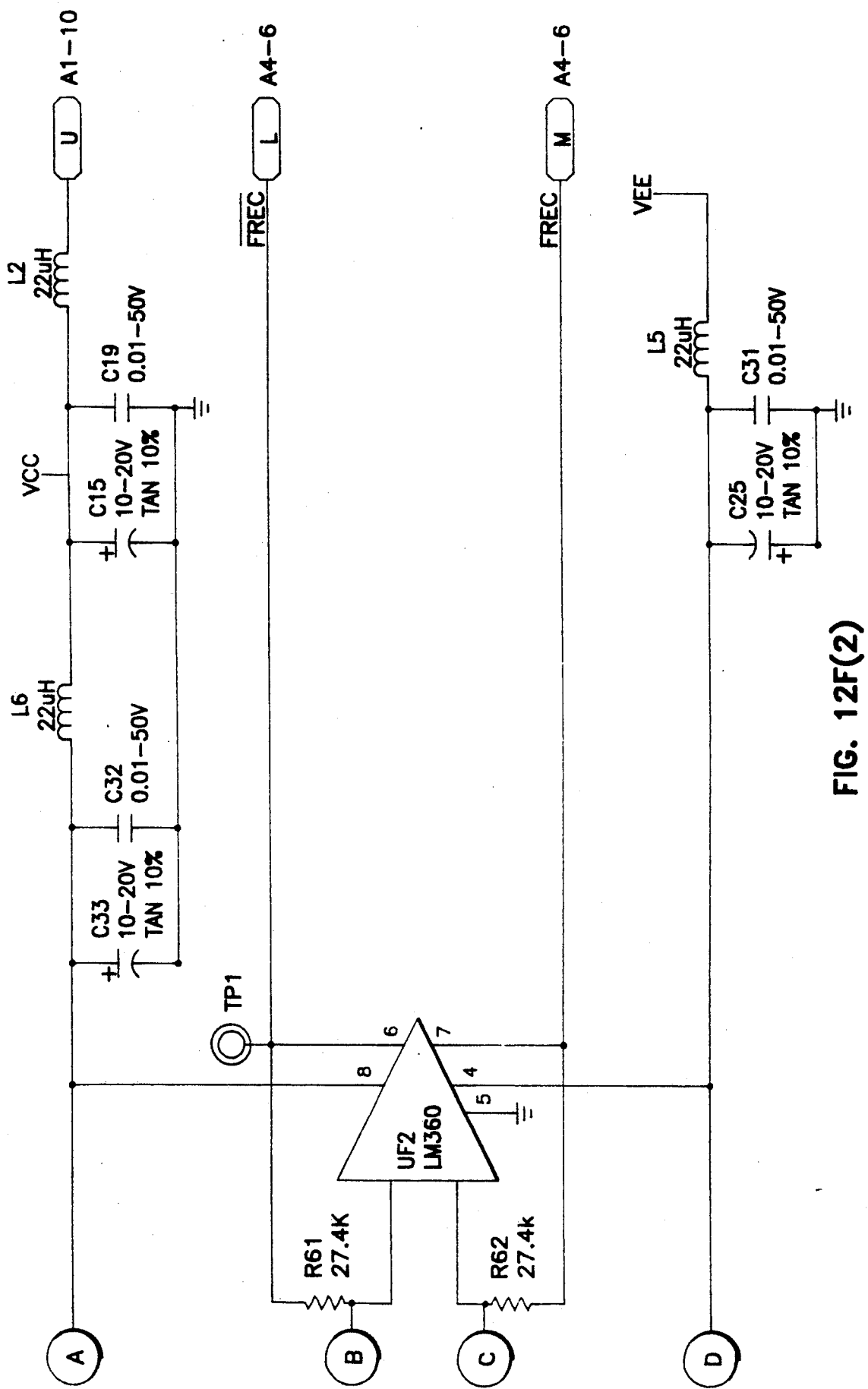
FIG. 12F(2)

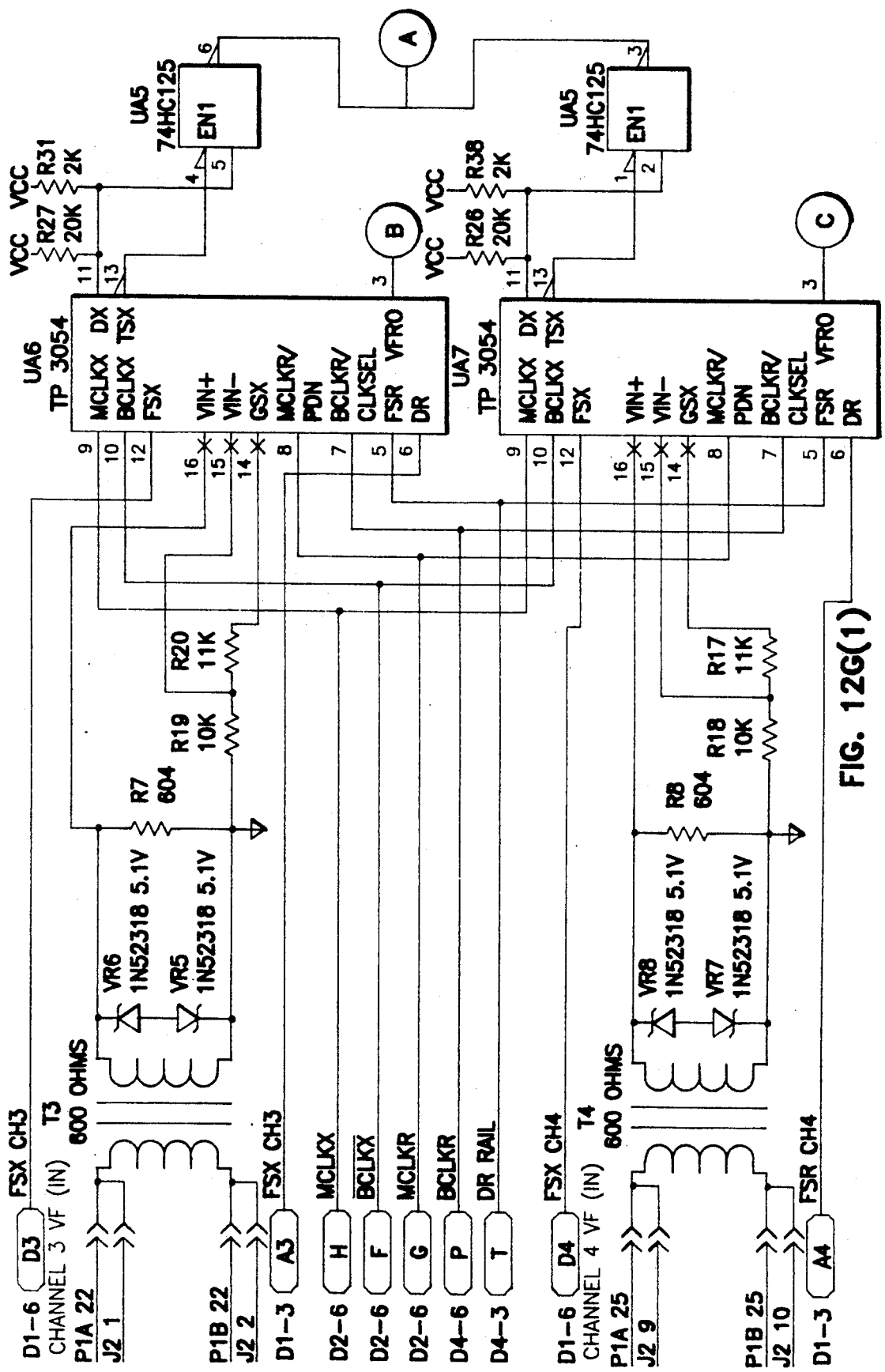
FIG. 12G(1)

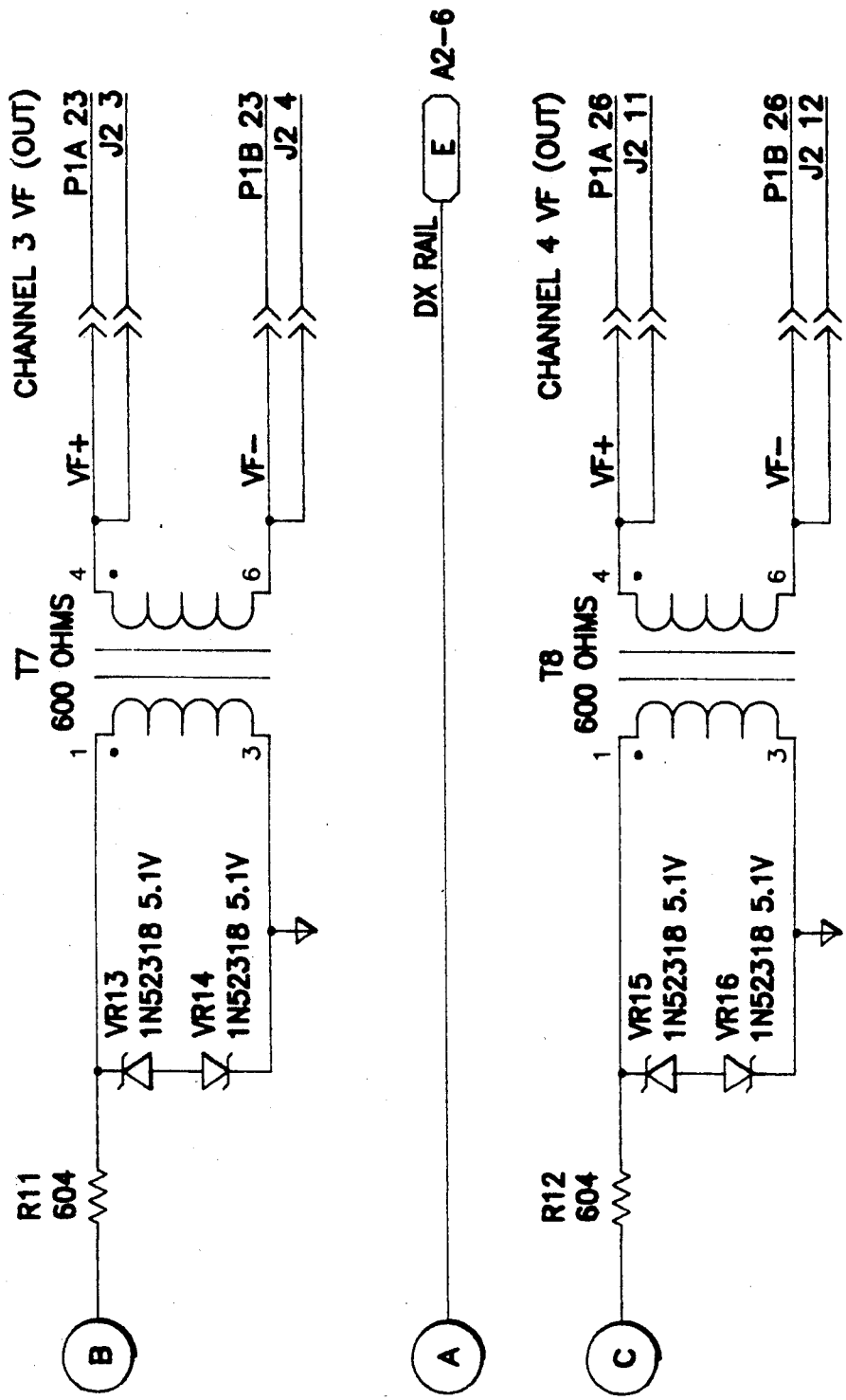
FIG. 12G(2)

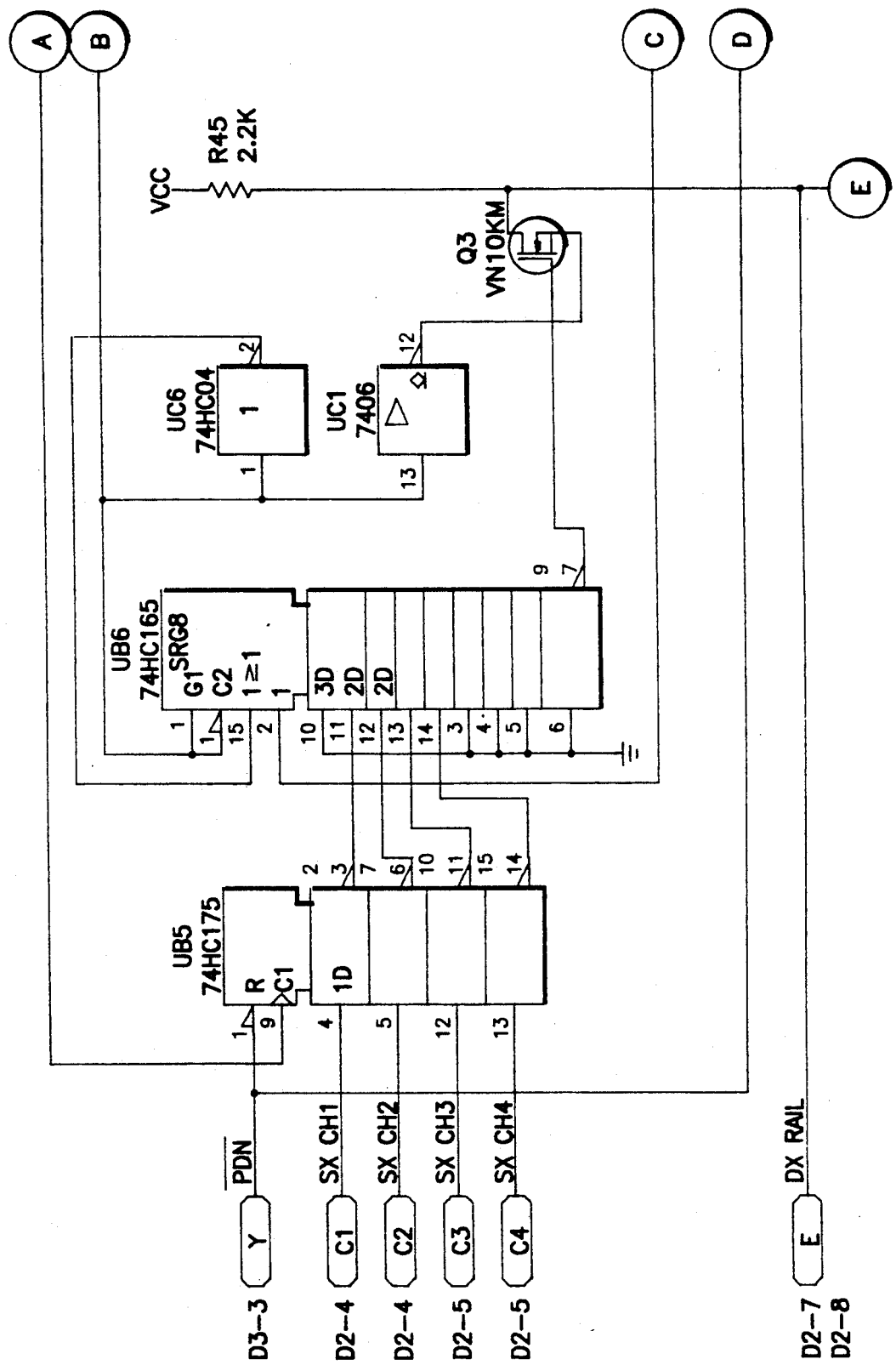
FIG. 12H(1)

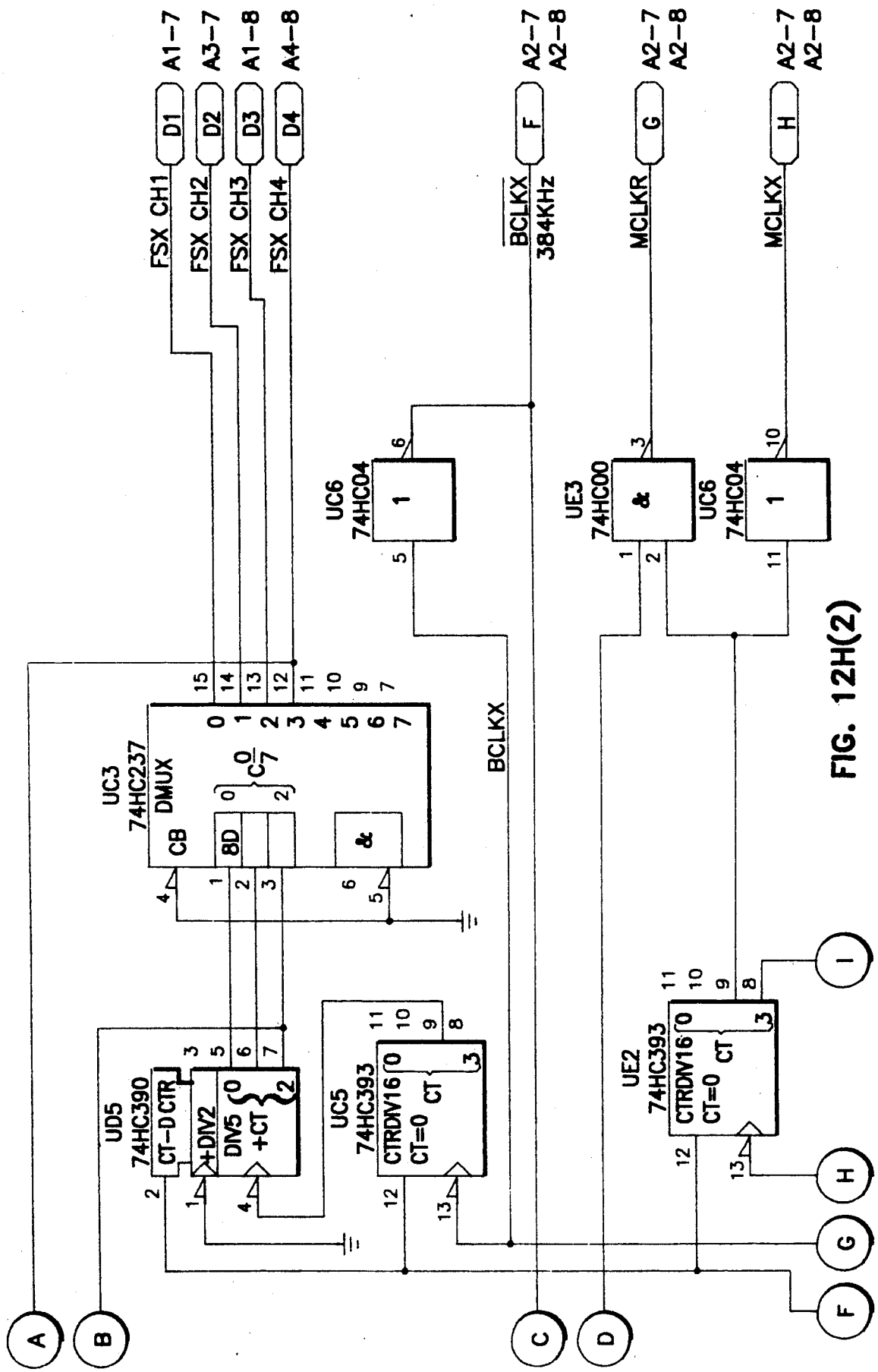
FIG. 12H(2)

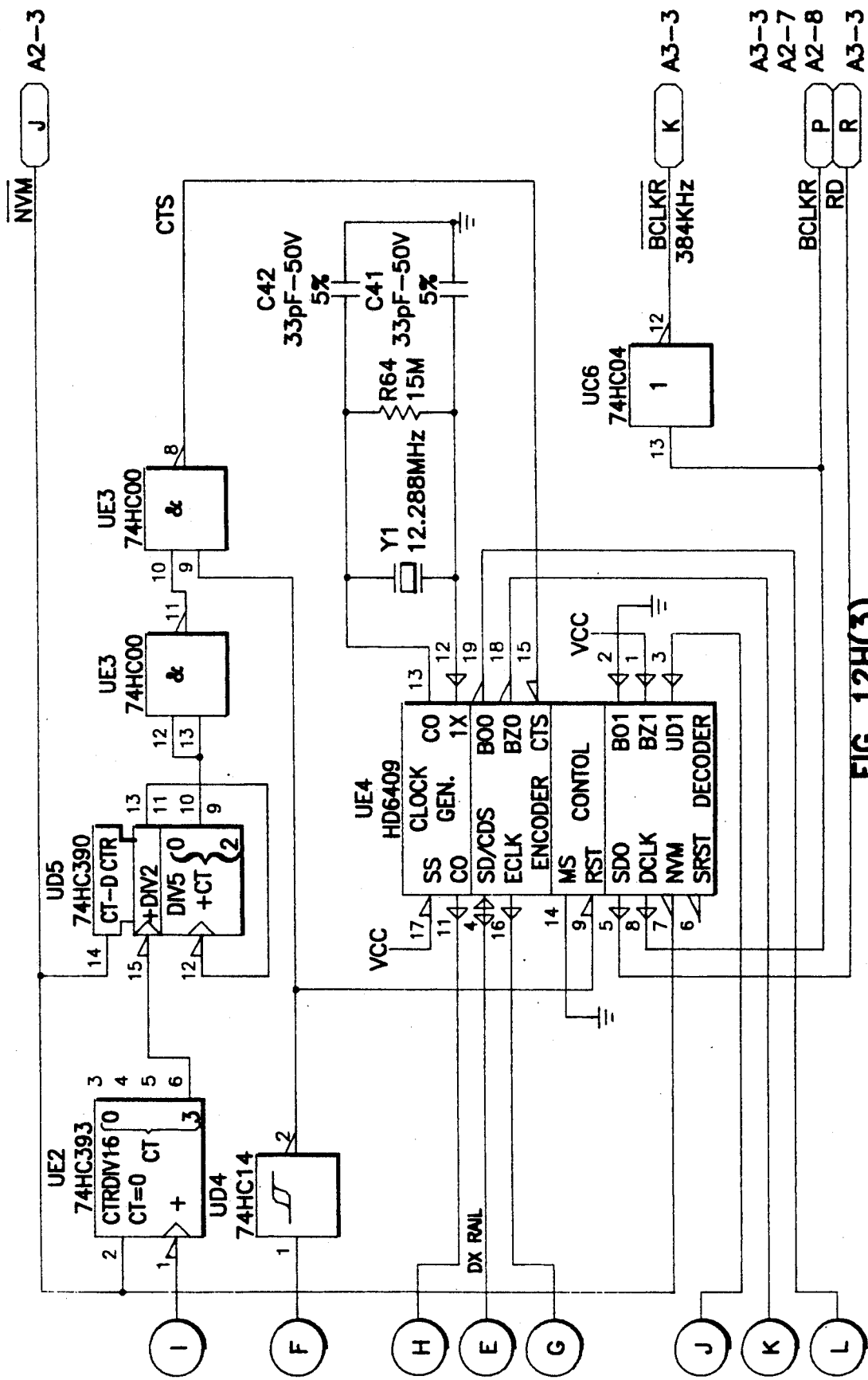
FIG. 12H(3)

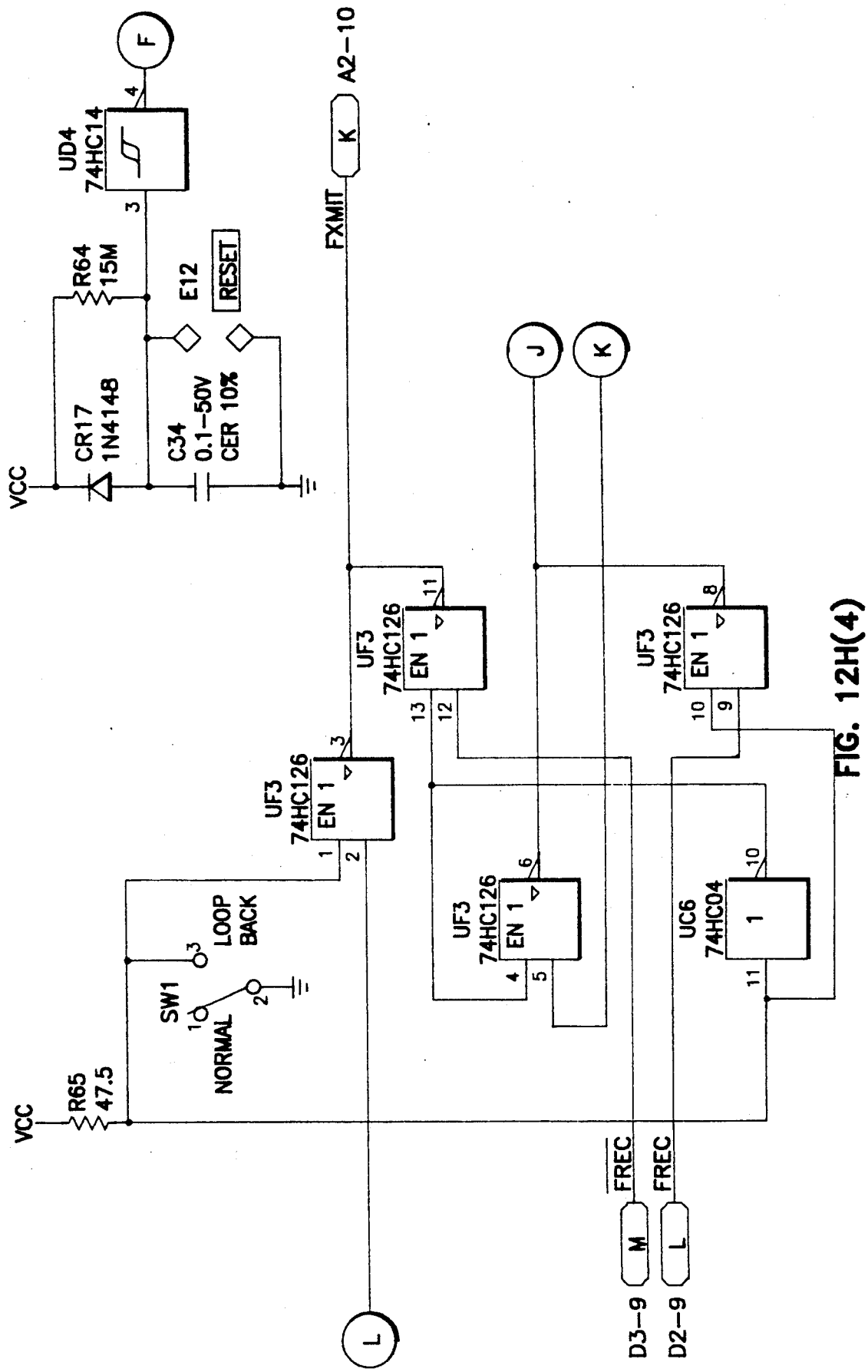
FIG. 12H(4)

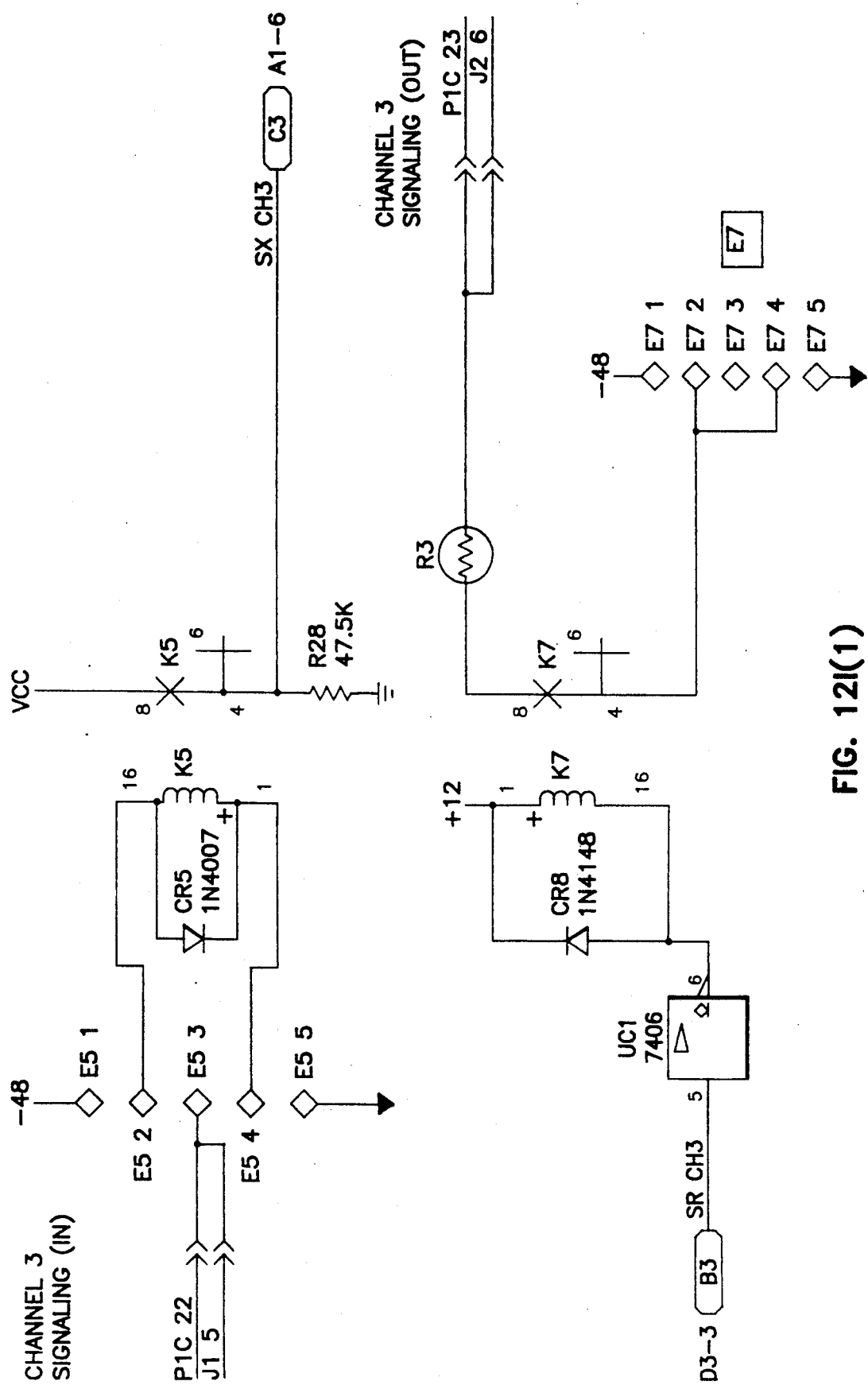
FIG. 12I(1)

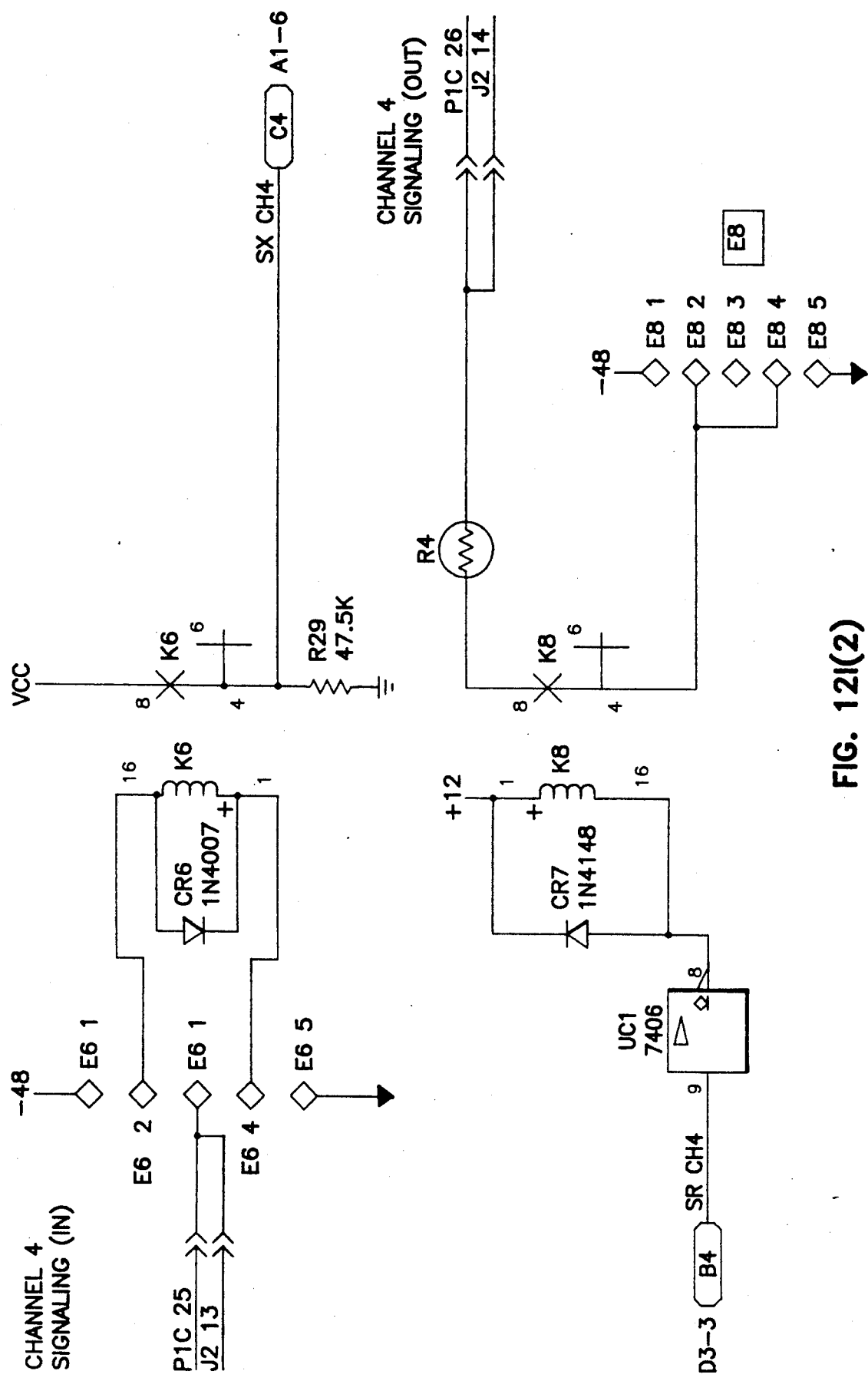
FIG. 12I(2)

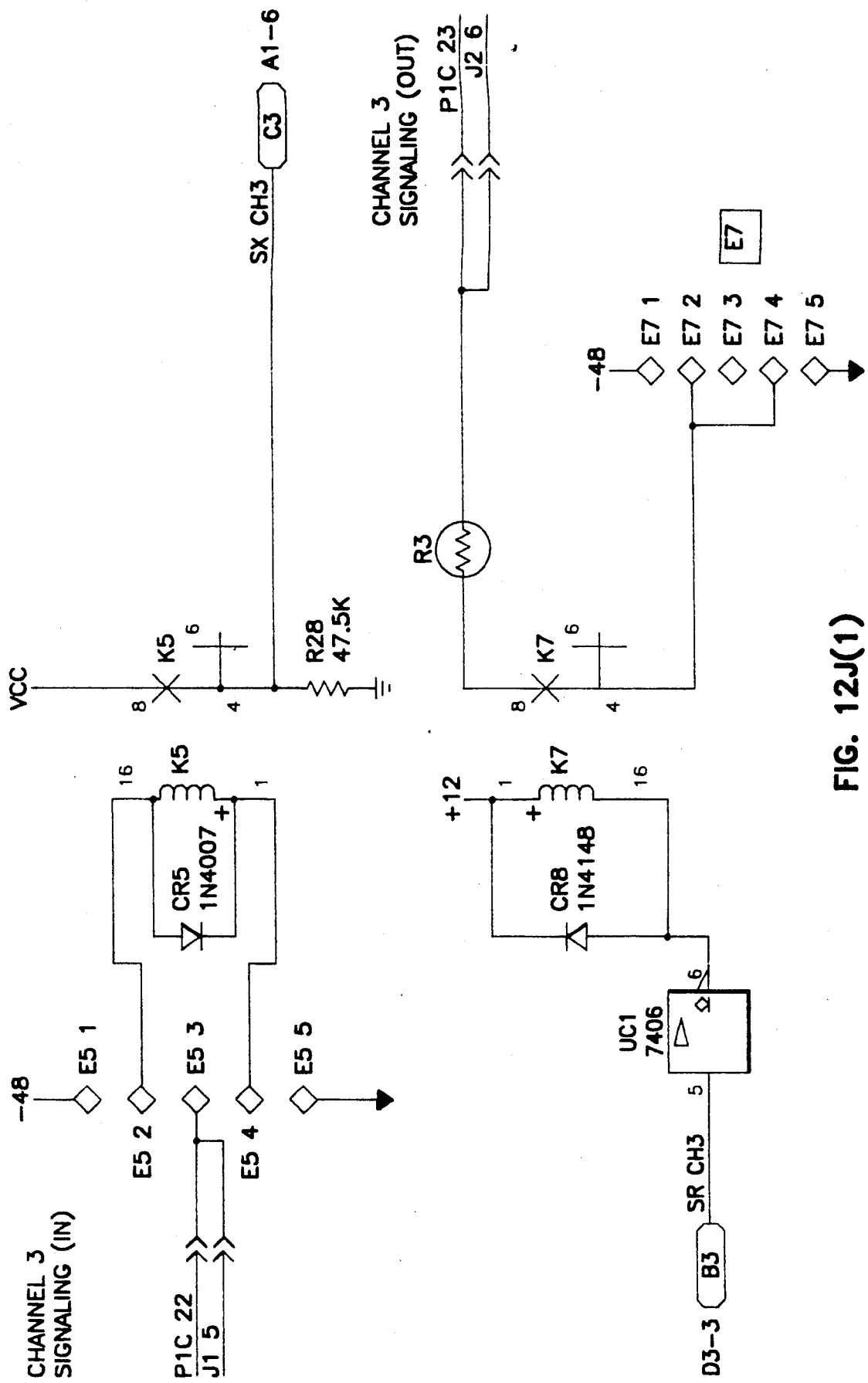
FIG. 12J(1)

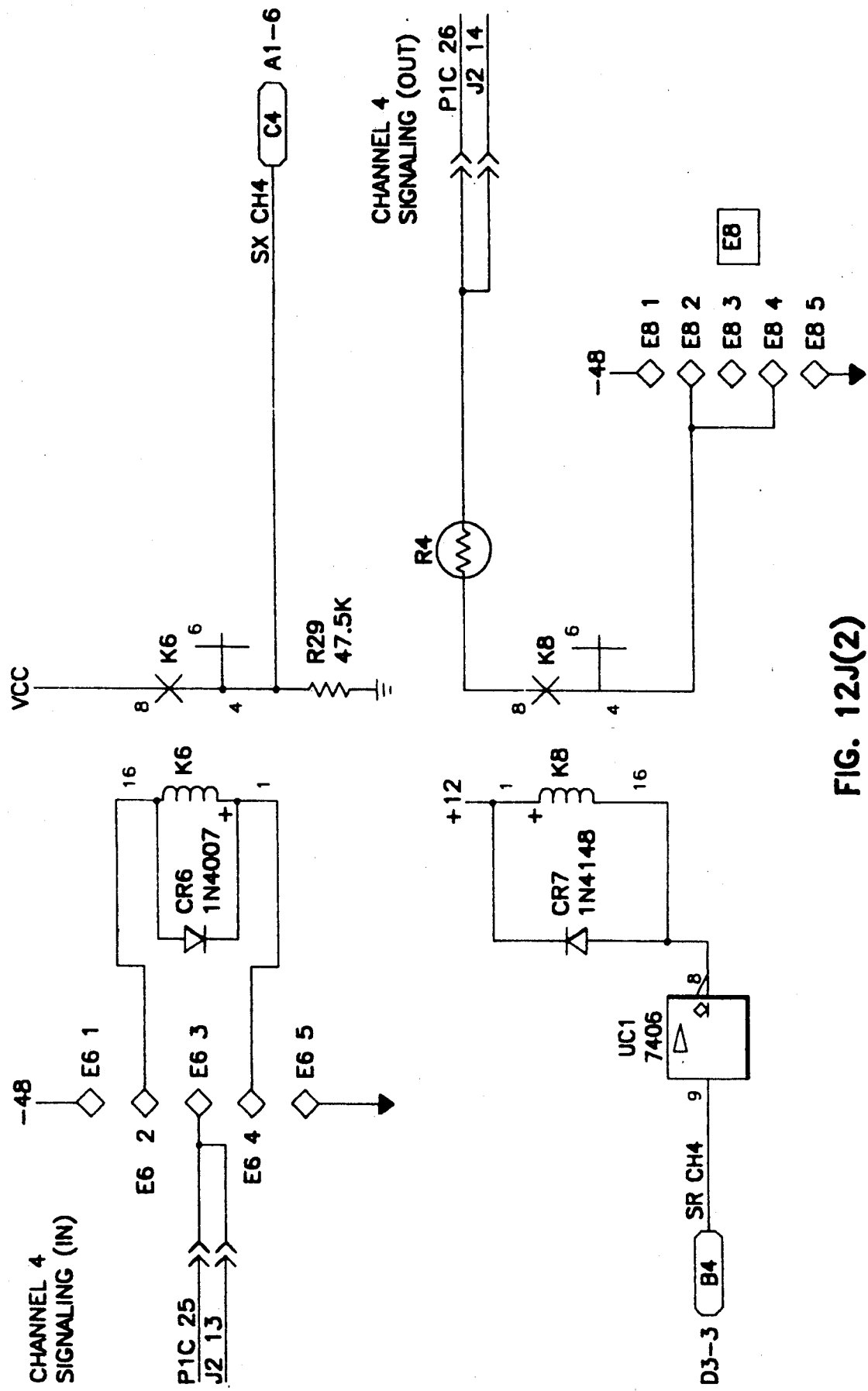
FIG. 12J(2)

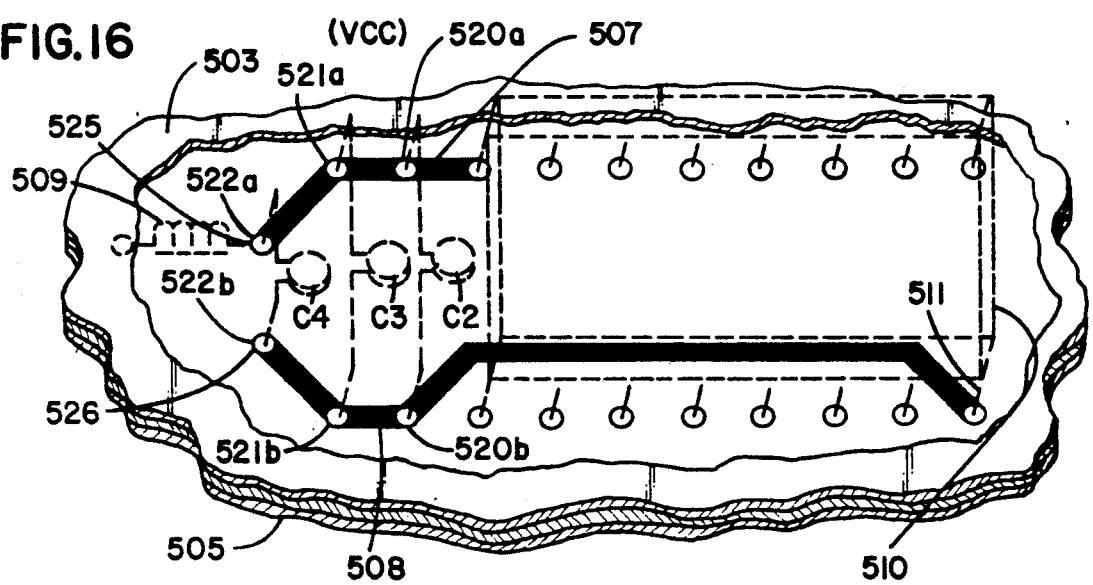

HIGH FREQUENCY NOISE BYPASSING

This is a division of application Ser. No. 204,751, filed 6/10/88.

TECHNICAL FIELD OF THE INVENTION

The present invention relates generally to the field of telecommunication and more particularly to the art of electrical to optical signal conversion.

BACKGROUND OF THE INVENTION

In U.S. Pat. No. 4,751,613 to Werdin and Henke, issued June 14, 1988, there is disclosed a low RF emission fiber optic transmission system. In that system there is provided a conversion unit which converts electrical signals to fiber optic signals and vice versa. The system can thus provide a secure fiber optic link between electrical systems. In addition, the conversion unit is designed to suppress and contain RF emissions from the conversion circuitry.

The system described in U.S. Pat. No. 4,751,613 is modular and permits specialized conversion modules to be mixed and matched. Modules for multiplexing and demultiplexing RS232-type data channels, test modules, power supply modules, high speed data conversion modules, voice frequency multiplexing modules and telephone interfacing modules are all contemplated by the system.

The present application discloses a modification to the conversion unit described in U.S. Pat. No. 4,751,613, together with certain additional new circuits and circuitry features for use in the conversion electronics thereof. More particularly, there is disclosed a conversion unit having front and rear modularity, a design methodology for implementing bypass capacitors to minimize RF emissions from the power lead of circuit components, a loop current regulating circuit for a PBX module and a voice frequency multiplexing circuit and method.

SUMMARY OF THE INVENTION

According to the invention, there is provided a method for bypassing high frequency noise generated by a circuit component mounted to a PC board. The method comprises mounting the bypass capacitors so that each capacitor forms a current loop from the power connection to the ground connection pin of said component, and connecting said power supply connection and said ground connection of said component to the power supply source and ground source on said PC board so that said connections are outside of said loop.

BRIEF DESCRIPTION OF THE DRAWINGS

FIGS. 12a through 12i are detailed schematic diagrams of the voice frequency multiplexing circuitry according to the present invention;

FIG. 16 is a perspective drawing showing the positioning of signal traces and bypass capacitors on a layout according to the present invention.

DETAILED DESCRIPTION OF THE INVENTION

Front-rear Modularity

Figure 1:
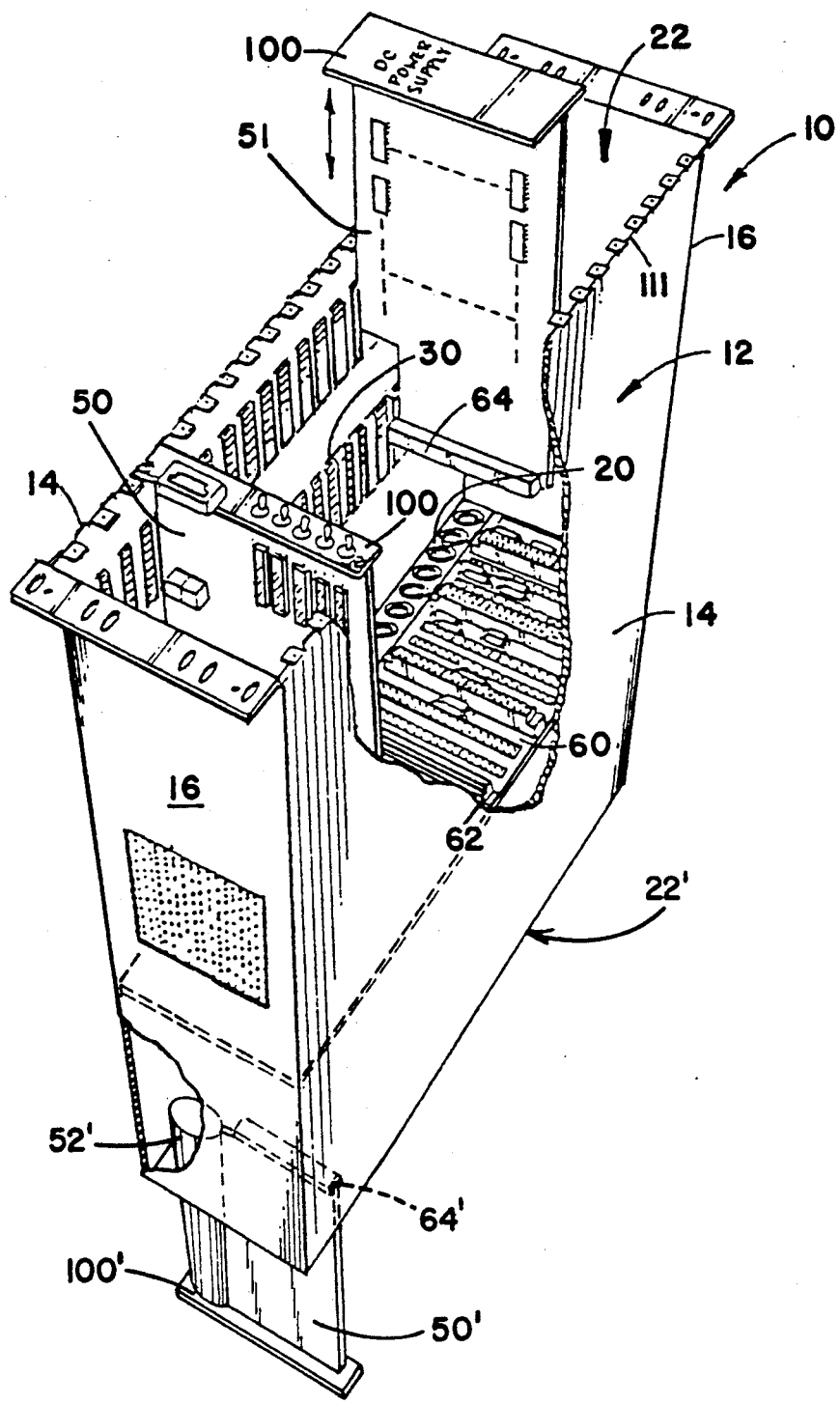
FIG. 1 is a perspective view of the conversion unit according to the present invention.

Referring now to FIGS. 1 through 8, there is shown a conversion unit 10 with front and rear modularity according to the present invention. Conversion unit 10 is a modified version of the conversion unit described in U.S. Pat. No. 4,751,613, the entire disclosure of which is hereby incorporated herein by reference. The interface unit 10 includes a housing/chassis 12 having top and bottom walls 14 and sidewalls 16. A motherboard 60 is mounted to extend across the rear end of the chassis in order to generally define a forward signal containment area 22 and a rear signal containment area 22'. A panel 20 with holes for fiber cables extends across the top of motherboard 60. The front end of area 22 and rear end of area 22' are covered by the various front panels 100 and 100' of card modules 50 and 50', respectively, or with blanks, as may be seen with respect to the views of FIGS. 4 and 5.

Figure 2:
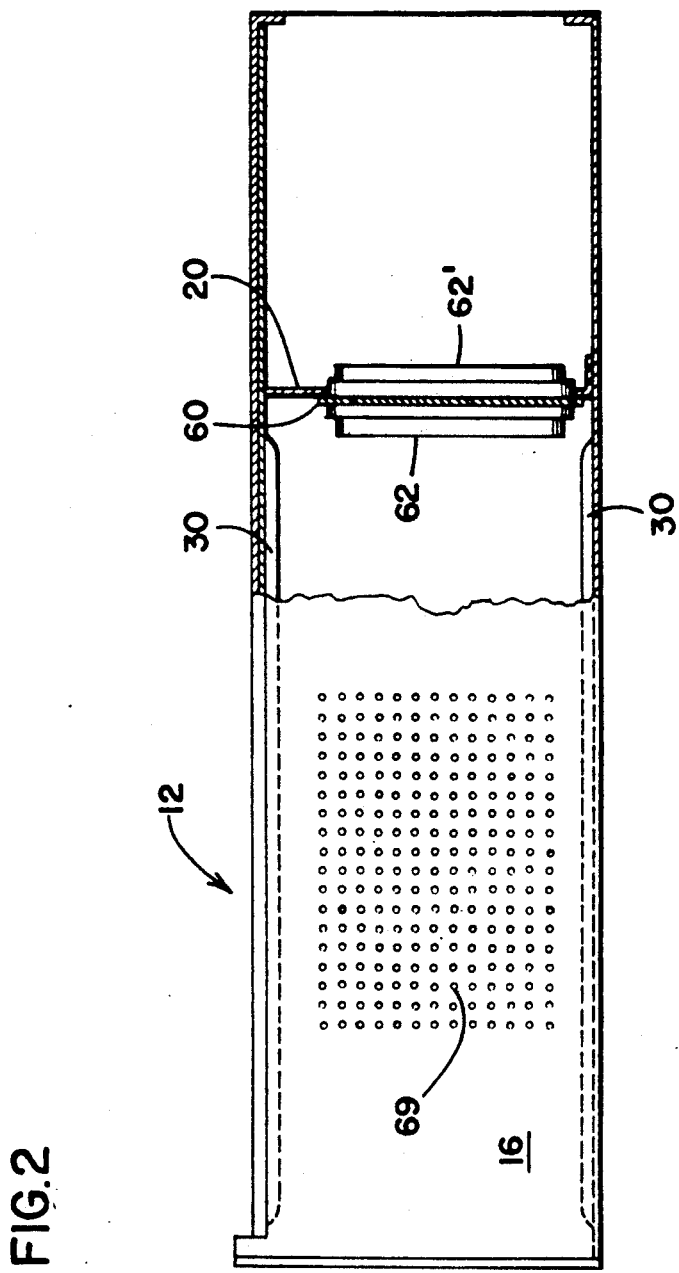
FIG. 2 is a side view of the conversion unit according to the present invention.
Figure 5:
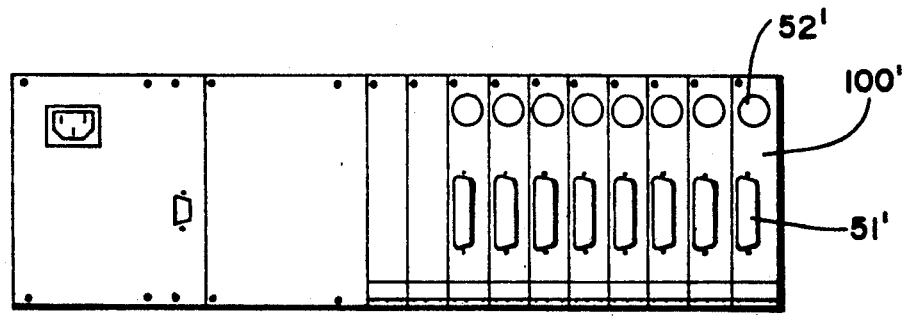
FIG. 5 is a rear view of the conversion unit according to the present invention.

As may be seen best with respect to FIGS. 1 and 2, the chassis 12 includes a plurality of card guides 30 which are formed from a single sheet of sheet metal and fixed to the top and bottom walls 14 to provide cooperating guides. As may be seen with respect to FIG. 1, a card module 50 may thus be mounted in the chassis 12 by sliding it in the front of the chassis. Each card module 50 comprises a printed circuit board mounted to a sheet metal support of roughly the same outline so that the sheet metal support slides in the card guides. The front panels 100 of each of card modules 50 are welded to the metal support, and the printed circuit boards are mounted to the support with metal stand-offs.

Figure 3:
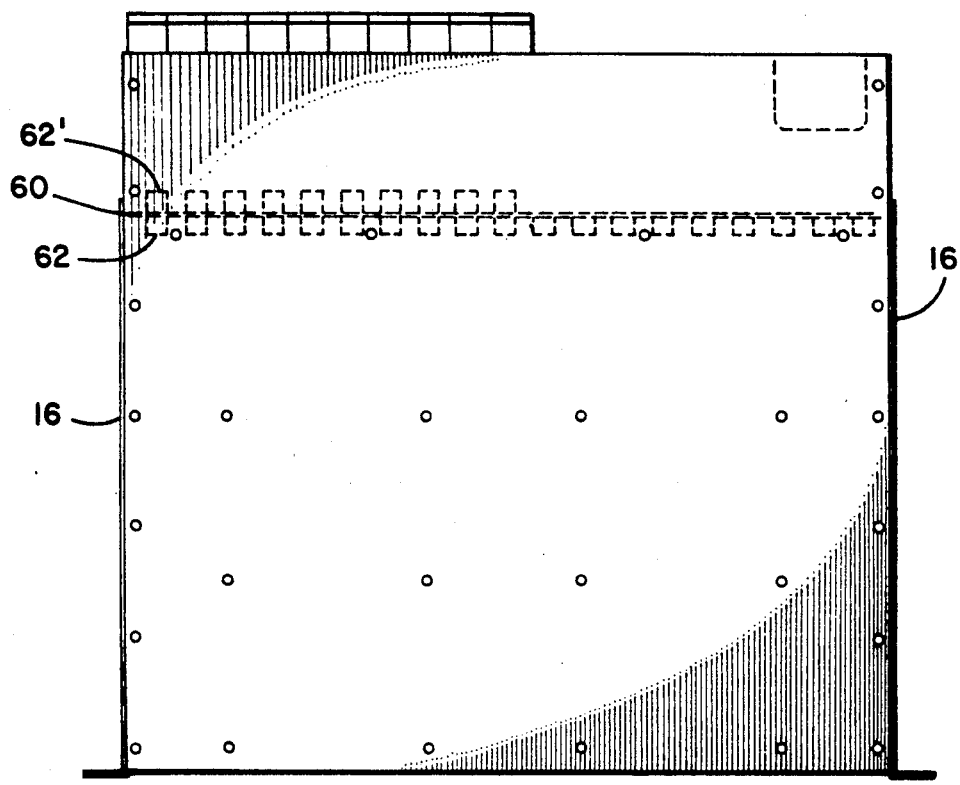
FIG. 3 is a top view of the conversion unit according to the present invention.
Figure 4:
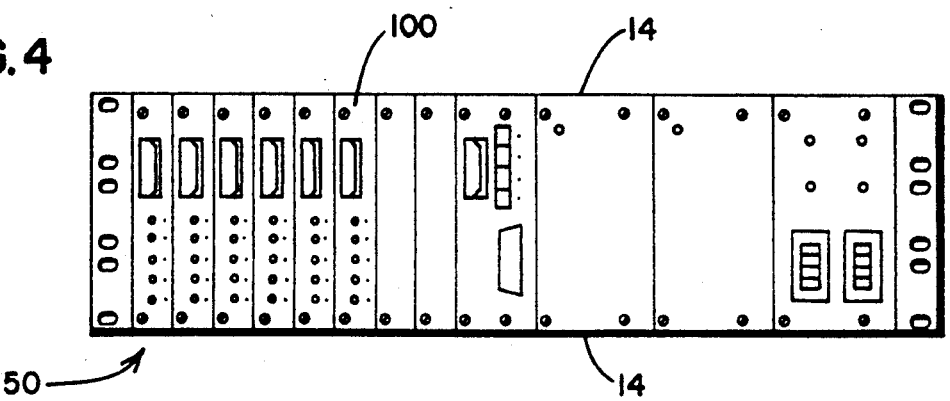
FIG. 4 is a front view of the conversion unit according to the present invention.
Figure 6:
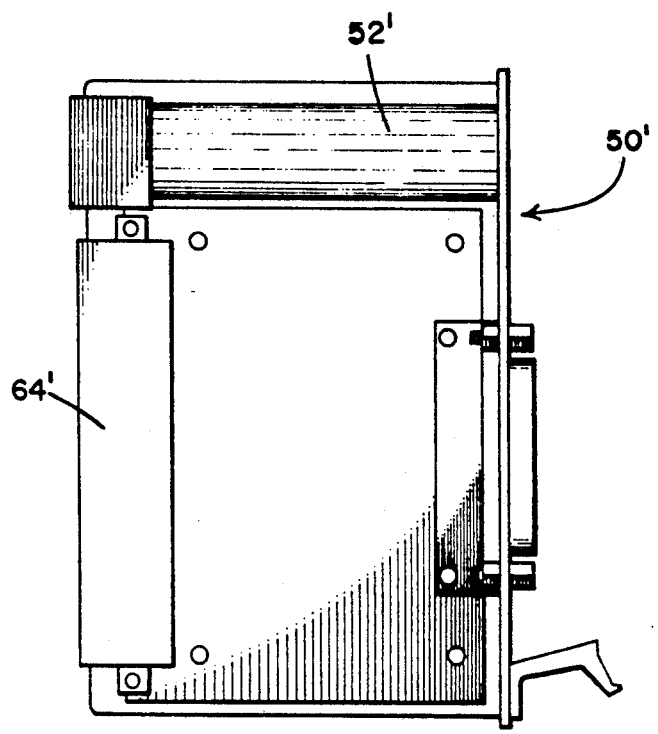
FIGS. 6, 7 and 8 are side, top and rear views of a rear conversion card module according to the present invention.
Figure 8:
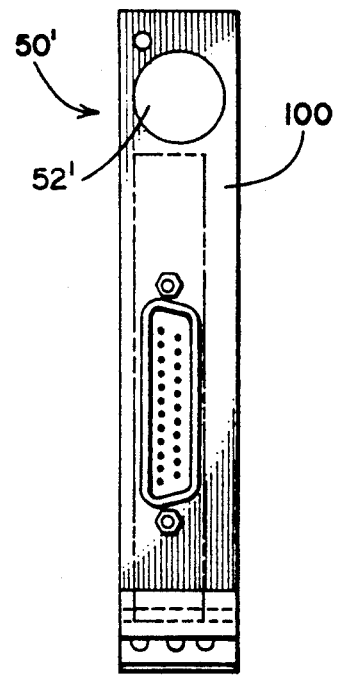
Figure 7:
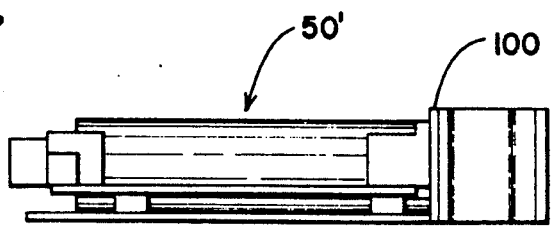

As may be generally seen with respect to FIGS. 1, 2, and 3, motherboard 60 includes a plurality of connectors 62 for receiving a mating DIN connector 64 of the modules 50. Motherboard 60 provides for power bus supply to the modules 50 as supplied from a power supply module 51, for example, and any other necessary bussing or connection between modules. Thus, a module 50 inserted in the chassis 12 mates with a corresponding slot in the motherboard 60.

As may be seen with respect to FIGS. 2 and 3, certain of connectors 62 are wired through motherboard 60 to corresponding connectors 62' on the other side thereof.

Connectors 62' face toward a rear area 22' of the chassis 12, and are each provided to receive the connector 64' of a rear card module 50'. The remaining connectors 62 may be female DIN connectors, to be used, for instance, where no rear modularity is required. Alternatively, as provided for in the chassis unit described in U.S. Pat. No. 4,751,613, connectors 62 are preferably 96 pin DIN connectors with a male having long tails which can be used to connect to outside data lines.

Preferably, the rear end of chassis 12 is designed in the same manner as the front end of chassis 12 to provide RF containment and suppression within the rear of the chassis; provided, however, card guides are not required because of the short length of the rear area 22'. Card modules 50', like modules 50, each include a printed circuit board mounted with a standoff to a sheet metal support, and a front panel 100' welded to the metal support. Modules 50', however, need not necessarily utilize the multilayered design of modules 50, as explained further below. In addition, each of modules 50' include a shielded connector 51' and an RFI waveguide 52'. Incoming and outgoing electrical signal lines and buses can be connected to the conversion circuitry through connectors 51', and fiber optic cables can be passed through waveguides 52'. Thus, the present invention modifies the conversion unit disclosed in U.S. Pat. No. 4,751,613 so that the front and rear of the unit are generally functionally symmetrical, except, however, that the rear signal containment area 22' and modules 50' are smaller than forward area 22 and modules 50, respectively. Further details on the preferred design of the front end of unit 12 may be found in U.S. Pat. No. 4,751,613. In particular, there are disclosed in U.S. Pat. No. 4,751,613 further details concerning the multi-layer circuit board technique, grounding techniques and circuit board mounting techniques and housing construction methods which play a part in the RF suppression strategy.

Figure 9:
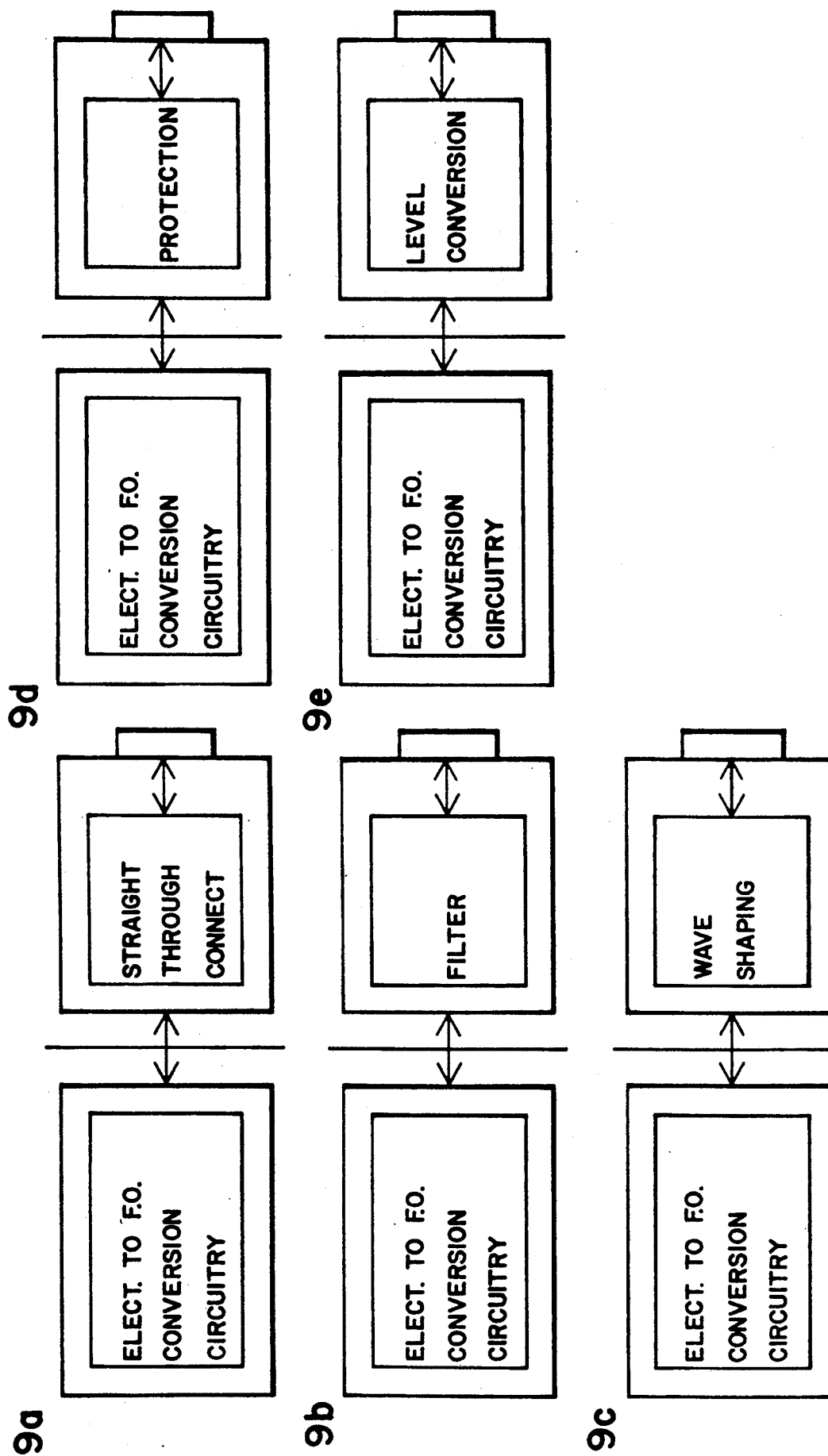
FIGS. 9a through 9e are schematic diagrams of applications of the front-rear modularity according to the present invention.

Referring now to FIGS. 9a through 9e, there is shown in schematic form various implementations of the front-rear modularity of conversion unit 10. In each of FIGS. 9a through 9e, circuit module 50 is represented as containing conversion circuitry for converting electrical signals to fiber optic signals and vice versa. For instance, the conversion circuitry may consist of multiplexing circuits for multiplexing a plurality of electrical signals onto a single fiber, digitizing circuits for digitizing analog electrical signals for transmission in digital fiber optic protocol, and various other circuits for converting electrical control signals to fiber optic signal counterparts, as needed to signal through the fiber optic link. As also shown in FIGS. 9a through 9e, rear module 50' may be configured to perform complementary signal processing functions such as filtering, waveshaping, protection, level conversion, or may simply consist of a straight through connection (FIG. 9a). Preferably, the signal processing functions carried out on rear module 50' do not involve high speed digitizing and multiplexing functions which normally give rise to the greatest source of RF emission in the conversion unit. Thus, module 50' may be formed of only two layers where source suppression of noise is not required.

The front-rear modular design of conversion unit 10 provides that the conversion circuitry of modules 50 may be readily adapted to interface with a variety of different electrical interfaces by providing custom rear modules 50'. Thus, front modules 50 may be standardized to a greater extent than otherwise possible, and mixed and matched with rear modules 50' to be adapted to various electrical interface systems. In addition, the front-rear modularity system provides that card modules 50 may be more readily adapted to custom applications because rear modules 50' preferably perform only a few functions and thus need only two layers, in most cases, may be more readily redesigned and produced.

Rear modules 50' may employ the multi-layered circuit board design set forth in U.S. Pat. No. 4,751,613 where desirable in noise generating circuit designs. It shall be understood, however, that the front-rear modularity concept is in no way limited to application in conversion units which require RF containment and suppression. Rather, this front-rear modularity may be readily employed in other electrical devices using circuit card modules in which it may be desirable to provide auxiliary signal processing.

VOICE FREQUENCY MULTIPLEXER

Figure 10:
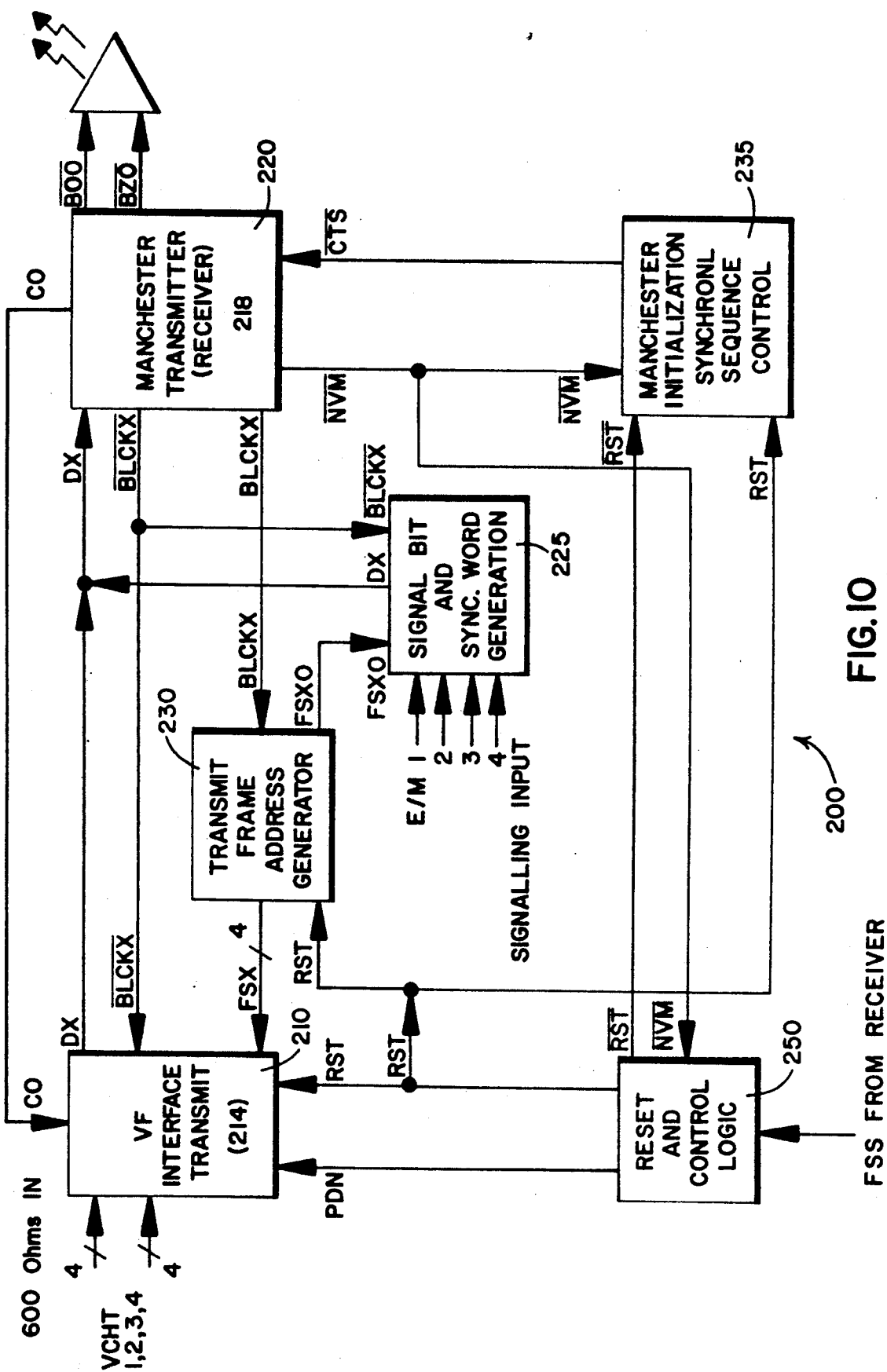
FIGS. 10 and 11 are schematic block diagrams of the transmitter and receiver sections of the voice frequency multiplexing circuitry according to the present invention.
Figure 11:
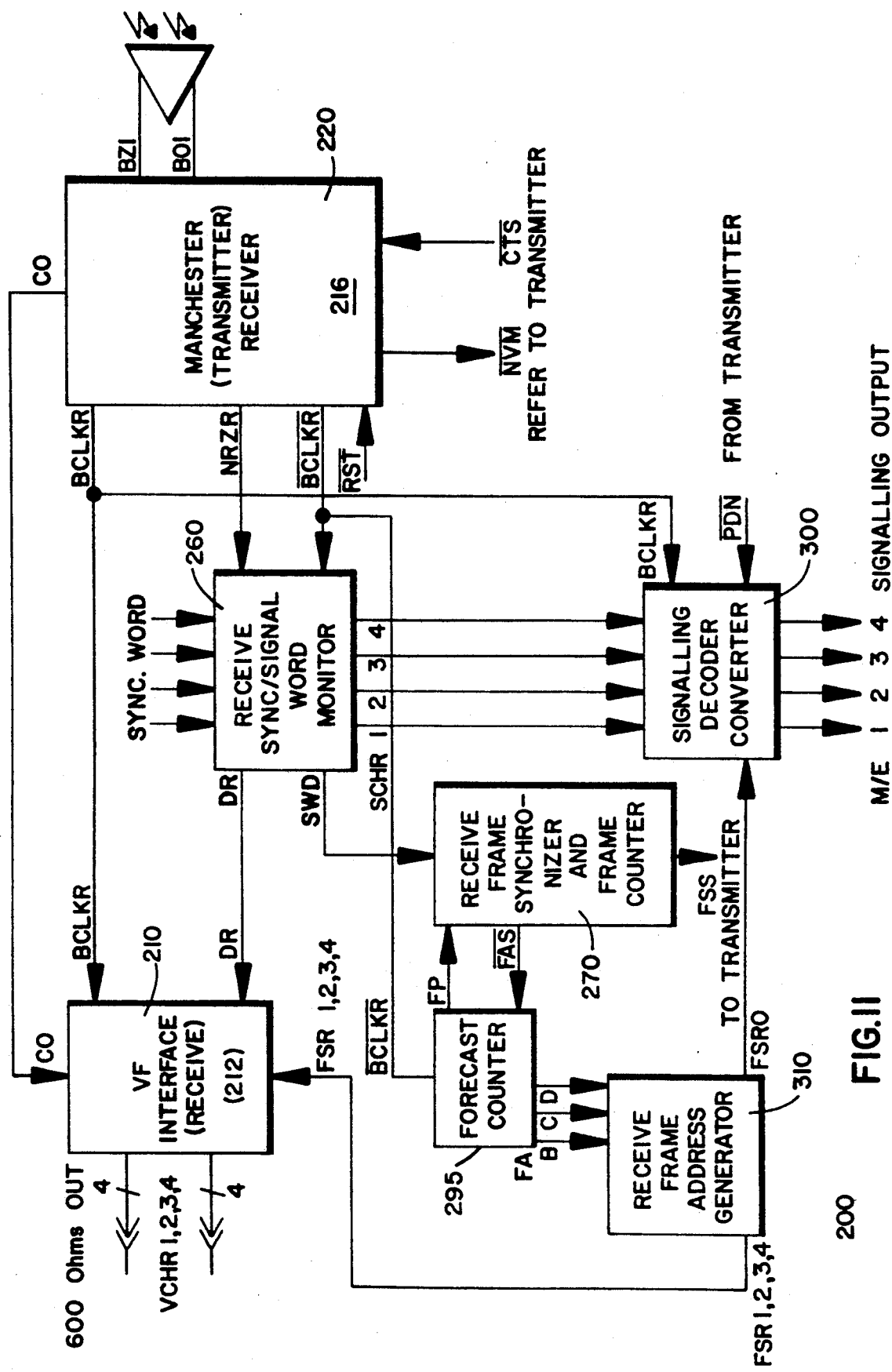

Referring now to FIGS. 10 and 11 there is shown in schematic block diagram form the transmitting and receiving paths, respectively, of the voice frequency multiplexing circuit module according to the present invention.

The voice frequency multiplexing circuit contains circuitry to convert analog information from four independent four-wire VF interfaces with E/M signalling into a digital format. The voice frequency multiplexer multiplexes this digital information into one single serial channel. This signal is converted into light waves which are transmitted over fiber optic cable. Received light waves from a remote multiplexing circuit are converted back to the four-wire VF interfaces with E/M signalling on the same circuit module. In addition, the voice frequency multiplexer circuitry provides electrical monitoring via 16 connectors. The circuitry further preferably includes local loopback of the remotely generated fiber optic signal and VF aggregate loopback of the serial data stream.

Various abbreviations are used with respect to the description of FIGS. 10 and 11, as follows:

Abbreviations

BCLKX—Bit clock transmit
BCLKR—Bit clock receive
DX—Data transmit PCM
DR—Data receive PCM
FSX—Frame synchronization transmit
FSR—Frame synchronization receive
E/M—Ear/mouth signaling
FP—Frame pulse
FSS—Frame synchronization signal
SCHR—Synchronization channel receive
CTS—Clear to send
NVM—Non-valid manchester code
CO—Clock out
BOO—Bipolar one out (Manchester)
BZO—Bipolar zero out (Manchester)
VCHR—Voice Channel Receive
VCHT—Voice Channel Transmit
VF—Voice frequency
PDN—Power down
SWD—Synchronization word detect VF Interface (Transmit/Receive)

A codec/filter 210 provides analog to digital and vice versa voice conversion. The codec 210 combines coder/decoder with internal switched capacitor filters for signal conditioning. Operation of the codec 210 receive Section 212 and transmit section 214 is fully asynchronous. Transmitted bit rate for the NRZ data is 384 bps. Transmit frame pulse rate is 76.8 kHz.

Manchester Transmitter/Receiver

A Manchester Biphase Encoder 220 converts the multiplexed serial NRZ data into an appropriate biphase signal. The manchester coder/decoder 220 consists of a transmit section 218 and a receive section 216. The decoder converts the serial biphase signal into a serial NRZ data stream. All timing references BCLKR and BCLKX within the multiplexer circuit 200 are derived from the serial biphase coder/encoder clock oscillator. Biphase masterclock is 12.288 MHz. NRZR and NRZ data encoding clock is 384 kHz. The decoder also provides the bit clock for the received NRZ data.

Signal Word and Synchronization Word Generation

Insertion of a repetitious synchronization word and status dependent signaling word is achieved with an eight bit parallel load shift register 225. The output of this shift register is TRI-state buffered and is connected to the transmit (DX) rail. Because this register receives the same framing information and operates in the transmit mode as the voice codecs, it can be viewed as a transmit section of a digital codec, thus providing a fifth channel.

The transmit frame address generator 230 provides time slot allocation for the framing of the five channels. The generator operates in a free running mode and has the following time sequence:

"CH5", "CH1", "CH2", "CH3", "CH4"

Channel 5 is the Synchronization and Signaling channel (hereinafter referred to as the S+S channel). Each frame consists of 8 bits. The S+S channel is divided into two sections, four bits for synchronization and four bits for signaling information for the four corresponding channels.

Manchester Synchronization Initialization Sequence Control

The Manchester synchronization initialization sequence circuit 235 provides the manchester transmitter/receiver with an appropriate timing sequence for its clear to send, hereinafter referred to as CTS, control input. A falling edge at the CTS input will cause the manchester transmitter to send a short synchronization initialization sequence which in return should be recognized by the remote manchester receiver, if connected. The CTS input will be toggled by the sequence control, and therefore cause the manchester transmitter to issue a synchronization sequence until a valid local manchester synchronization initialization sequence has been detected and is present at the NVM output. A synchronization sequence is also issued upon power-up reset.

Reset, Control and Fault Indications

The reset, control and alarm logic 250 generates power-up reset signals, manchester initialization sequence signals, loss of synchronization indication.

Receive Synchronization/Signal-Word Monitor

The incoming decoded NRZ bit stream is being clocked into an 8 bit serial-in/parallel-out register 260 with the decoded bit clock. The outputs e.g. A, B, C, D are dedicated to the four signaling bits, e.g. E, F, G, H are dedicated to the synchronization word detection.

Receiver synchronization is achieved by monitoring the decoded NRZ bit stream and looking for the matching 4 bit (E.F.G.H) synchronization word. Upon detection of a bit pattern which matches the code of the synchronization word a detection pulse is generated.

Receive Frame Synchronizer and Frame Counter

A receive frame synchronizer 270 and frame counter are also provided. When detection of the first synchronization detect pulse occurs the forecast counter 275 is initialized to predict the position for the synchronization word within the next frame. The forecast counter 295 operates as a frame window generator to allow the detection of a synchronization word only at a certain time and frame instant. In order to provide reliable synchronization with a 4 bit word the synchronizer 270 must average over a period of incoming synchronization frames. This can be accomplished with the forecast counter 295 in conjunction with an up/down counter. The incoming NRZ bit stream is being clocked with the decoded bit clock into the receive sync/signal word monitor 260. A 4 bit magnitude comparator monitors the output of the register for equivalence with the synchronization word code. A synchronization word detect pulse for the duration of a clocking pulse indicates the reception of a synchronization word. If the up/down counter (part of 270) is at its lowest possible count, indicating a loss of synchronization, the forecast counter 275 will then be reset by the synchronization detect pulse and the up/down counter advances one step up. Now the forecast counter 275 is able to provide the frame window for the prediction of the postceding synchronization word. This method reduces the possibility of falsely causing the synchronizer 270 to lock on a pseudo synchronization word, generated by any of the residual frames. Detection of a preceding synchronization word will advance the up/down counter again. Detection of no synchronization word at the predicted time slot will retard the up/down counter.

Count advancing from the lowest (loss of synchronization point) to full synchronization is accomplished in sixteen levels:

| level 1: | 0 count, full loss of synchronization |
| level 2: | 1st count, 1st predicted sync word recognized |
| level 3: | 2nd count, 2nd predicted sync word recognized |
| level 4: | 3rd count, 3rd predicted sync word recognized |
| level 5: | 4th count, 4th predicted sync word recognized |
| level 6: | 5th count, 5th predicted sync word recognized |
| level 7: | 6th count, 6th predicted sync word recognized |
| level 8: | 7th count, lowest level of synchronization |
| level 9: | 8th count, lowest level of synchronization |
| level 10: | 9th count, lowest level of synchronization |
| level 11: | 10th count, lowest level of synchronization |
| level 12: | 11th count, mid level of synchronization |
| level 13: | 12th count, mid level of synchronization |
| level 14: | 13th count, mid level of synchronization |
| level 15: | 14th count, mid level of synchronization |
| level 16: | 15th count, top level of synchronization |

In case that the synchronization word cannot be detected at the forecasted position, the up/down counter will be retarded for one count. This will happen until the zero count is reached. Only at the full loss of synchronization (counter zero count) the forecast counter can be reset upon reception of a synchronization word for a new timing window position.

The forecasted word synchronization method described has various advantages, as follows:

(a) reliable synchronization once synchronization has been detected (b) high synchronization signal to noise ratio due to the relative slow averaging synchronization mechanism (c) bit errors within signal or few synchronization words do not disrupt multiplex synchronization (d) allows transmission of unrestricted digital information (e) fast resynchronization times (typically less than 1 ms)

During power down or initialization sequence the codecs transmit in idle or standby bit pattern which does not contain a steady stream of synchronization words. This feature ensures a secure resynchronization after power down signal periods. Any loss of synchronization will mute the codecs and force the idle pattern to be transmitted. Also, all signaling bits are forced to a non-active state.

Signaling Decoder Converter

A signaling decoder converter 300 is provided. Signal bits (A,B,C,F) are latched and fed to the output signal ports at mid and top level of the synchronizer position. The TTL level is converted to the E and M levels.

Receive Frame Address Generator

A receive frame address generator 310 is also provided. This address generator provides the time slot allocation between the five receive channels of the multiplexer. The generator is controlled by the output of the forecast counter. Each forecast count pulse will initiate the known transmit sequence:

"CH5", CH1", CH2", CH3", CH4"

Note: Channel 5 is the synchronization and signaling channel and transfer the appropriate timing signal to the corresponding codec receive section.

Further details of the design of the voice frequency multiplexer circuitry may be found in FIGS. 12a-i, which are detailed schematics of a preferred form of said circuitry. Where the voice frequency multiplexer circuit is utilized in an environment requiring low noise, it shall be understood that it would be preferred to employ it using the multi-layered circuit board design disclosed in U.S. Pat. No. 4,751,613. It shall be understood, however, that the application of the circuit is in no way limited to such application.

Circuitry for Regulation of Loop Current Between Co and PBX Emulator

Figure 13:
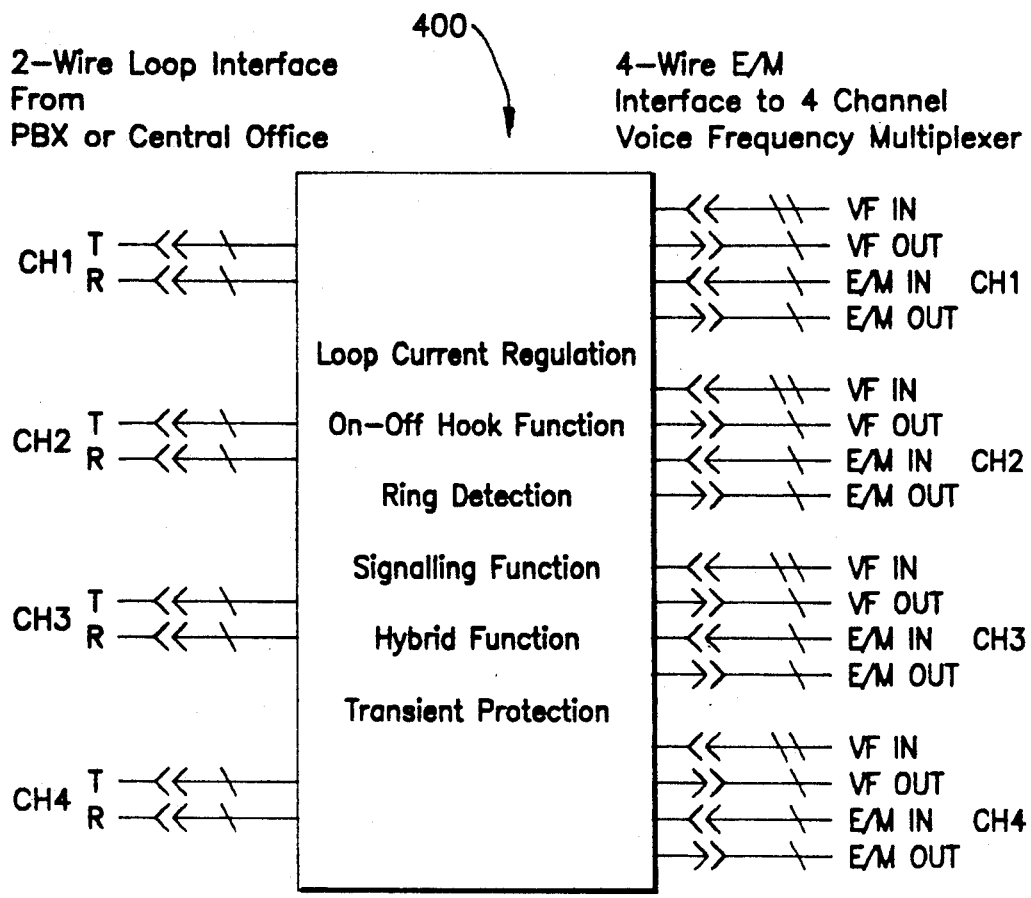
FIG. 13 is a block diagram of the PBX module according to the present invention.

Referring now to FIG. 13 there is shown a schematic block diagram of the PBX interface circuitry 400 according to the present invention. The PBX module 400 contains circuitry to convert four two-wire loopstart VF circuits into four-wire VF with E/M type signaling. Module 400 is used in connection with the voice frequency multiplexer, which takes the four four-wire VF output channels and multiplexes them over a single fiber optic cable. As illustrated in FIG. 13, module 400 thus performs the following functions:

(a) two-wire to four-wire hybrid function (b) secondary overvoltage protection (c) switch hook detection (d) loop current regulation (e) ring detection (f) E/M signaling translation (g) signal isolation, (h) FCC 68 compatibility.

Figure 14A:
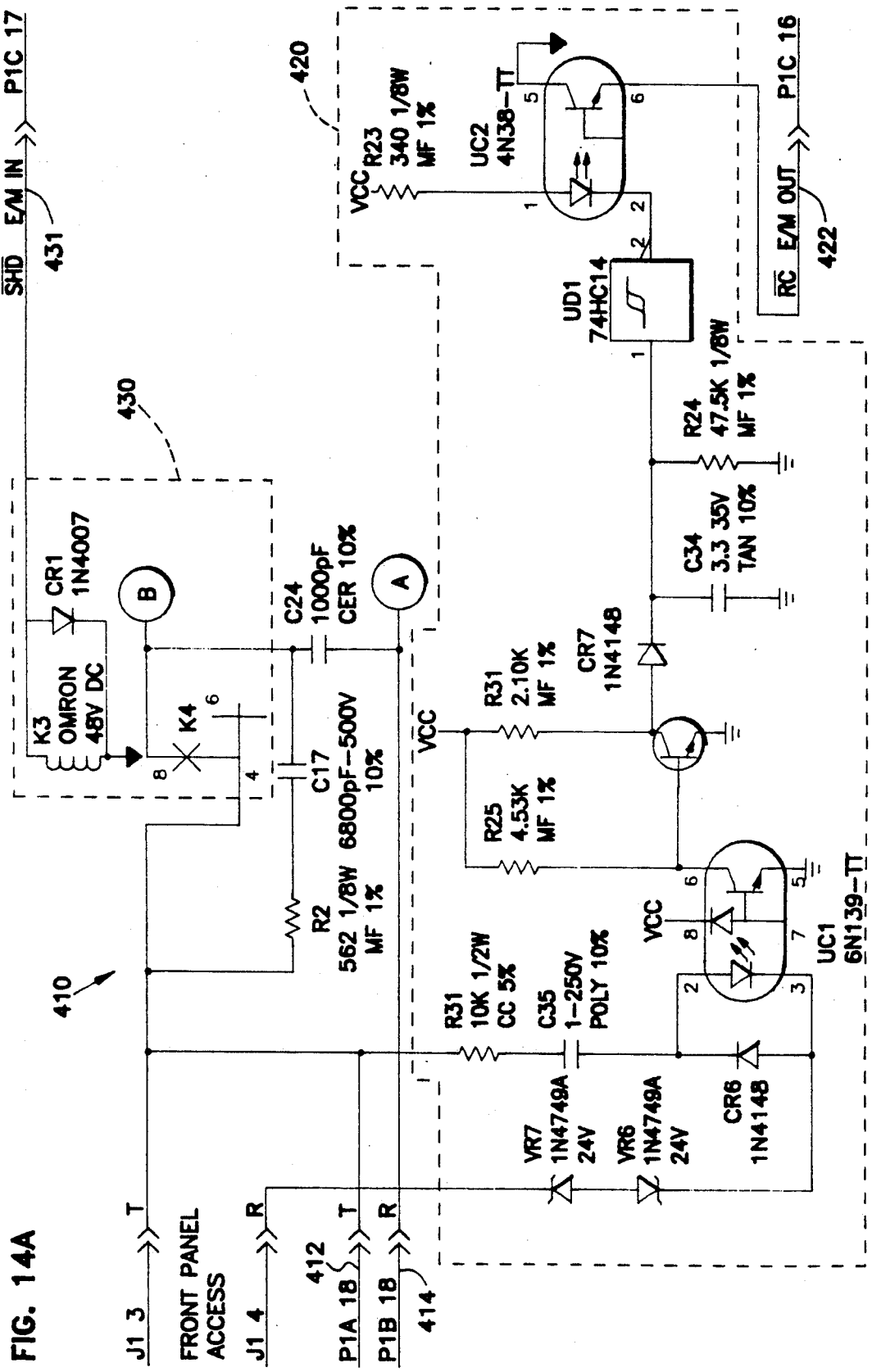
FIG. 14 is a detailed electrical schematic of the circuit for regulating loop current in a loop between a central office and a PBX emulator.
Figure 14B:
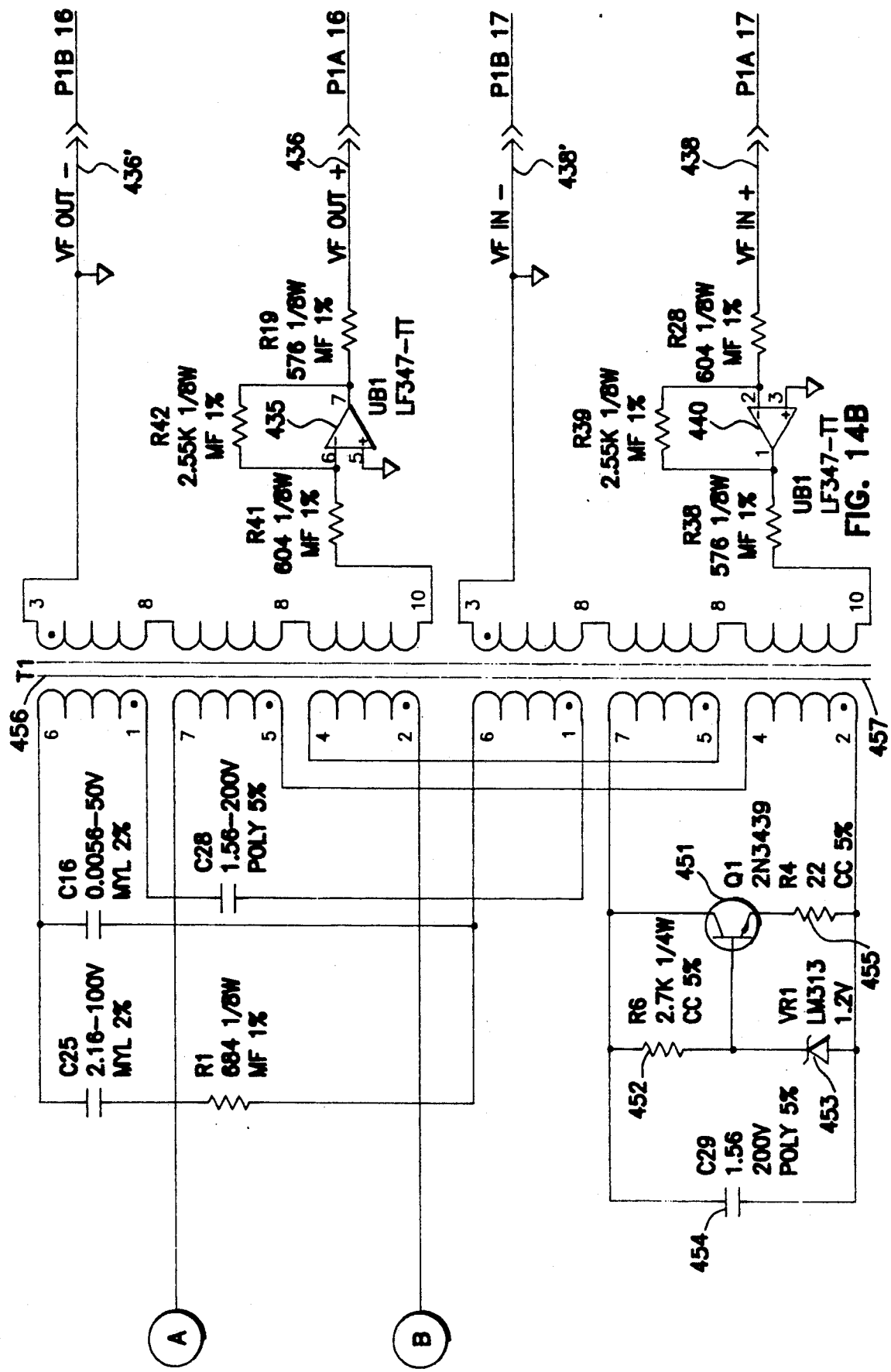

Referring now to FIG. 14 there is shown a detailed schematic diagram of one of the channels of PBX module 400. Channel circuitry 410 receives Tip (T) and Ring (R) signals on conductors 412 and 414, respectively. The circuitry within the phantom line box 420 provides means for detecting ringing on the circuit and converting it to a ring control signal 422. A relay 430 is provided, and is controlled by an incoming switch hook detect signal SHD. Transformers T1 and T3 are provided whereby signals carried on conductors 412 and 414 are picked up by amplifier 435 and output on conductor 436 and whereby incoming signals on conductor 438 are conveyed through amplifier 440 and transformer T3 onto Tip and Ring conductors 412 and 414.

The aspect of circuit 410 of particular interest to the present invention is the loop current regulation circuit contained within the phantom line box 450. This loop current regulation circuit comprises transistor 451, resistor 452, voltage reference 453, and capacitor 454 and resistor 455.

The aspect of circuit 410 of particular interest to the present invention is the loop current regulation circuit contained within the phantom line box 450. This loop current regulation circuit comprises transistor 451, resistor 452, low power voltage reference 453, capacitor 454 and resistor 455.

Regulation of the loop current in this particular application provides the PBX interface module (or PBX emulator) with a much narrower and controlled current range than would normally be found in such applications (20 mA to 120 mA typical). Application of the loop current regulator limits this range to approximately 60% (23 mA to 40 mA typical). Lowering the loop current range allows the use of much smaller, more reliable and cheaper audio transformers 456 and 457.

The loop current regulator is based on that of a constant direct current (DC) souce type regulation. Capacitor 454 provides alternating current (AC) bypassing for voice type signals.

Current regulation is accomplished by maintaining a constant voltage over mode 2 and mode 3 using a wide range reference diode 453. The reference diode 453 regulates the voltage over mode 2 and mode 3 to approximately 1.2 v over a current range of 500 uA to 50 mA. Forward current to the reference diode 453 is limited by resistor 452. Transistor 451 operates in the linear mode. The base of transistor 452 (node 2) is regulated by the reference diode to 1.2 v. The forward bias voltage drop over the base to emitter diode of transistor 451 is approximately 0.7 v. This base to emitter forward bias voltage will change with temperature but this voltage drift can be tolerated due to the non-critical regulation requirement. The constant voltage drop over resistor 455 can be calculated to 0.5 v (1.2 v−0.7 v). Using a 22 Ohm value for resistor 455, the resulting constant current can be calculated to approximately 23 mA (0.5 v/22 Ohms).

Thus, the application of a wide range constant current source in this case reduces transformer size and thus increases packing density.

In implementation, the PBX module 400 is connected with a voice frequency multiplexing circuit as described above. The voice frequency multiplexing circuit receives the switch hook detect, ring control signal and voice frequency signals from the circuitry 410 of the PBX module whereby a two-wire PBX interface is provided for each channel of the four channel voice frequency multiplexer module. Where the PBX model 400 is utilized in an environment requiring low noise, it shall be understood that it would be preferred to employ it using the multilayered circuit board design disclosed in U.S. Pat. No. 4,751,613. It shall be understood, however, that the application of the current regulating circuitry is in no way limited to such application.

Figure 15:
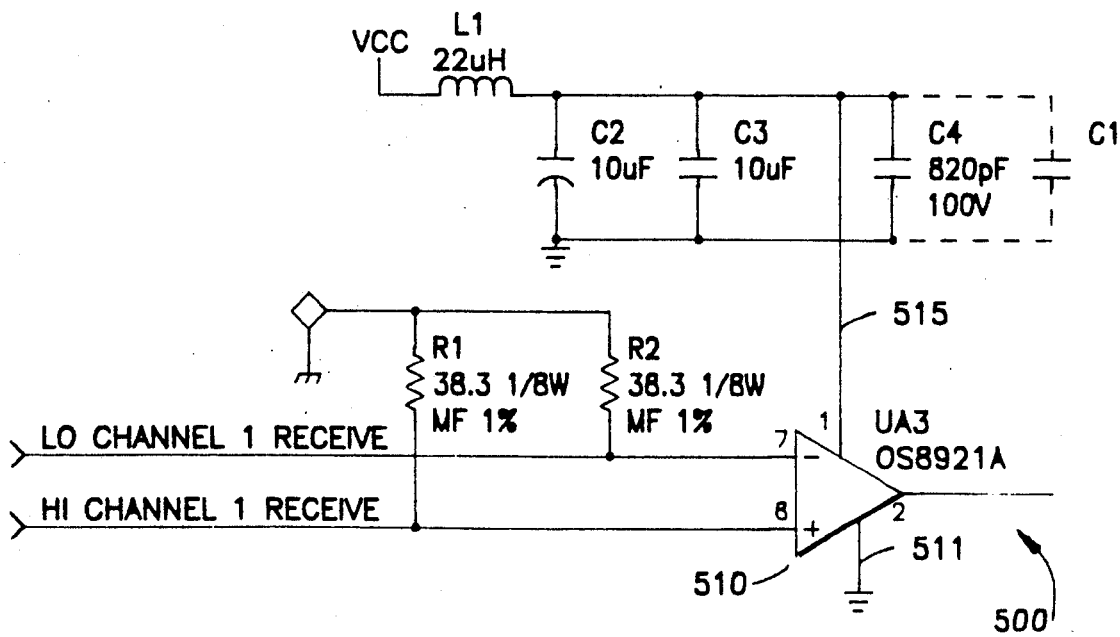
FIG. 15 is an electrical schematic diagram of a typical component of a module according to the present invention.

Method for Bypassing High Frequency Noise from the Power Connection of Components Referring now to FIG. 15 there is shown an electrical schematic of an example of an input stage of a conversion module which may be used in the conversion unit of the present invention. Circuit 500 may comprise, for instance, an input buffer for a high speed conversion module. Circuit 500 includes a buffer amplifier 510 connected to a source of power VCC through a 22 UH inductor element and to a signal ground 511.

As is conventional in the prior art, several capacitors C2, C3 and C4 of varying capacitances are provided to bypass the various high frequency noise components emitted from the power connection 515 of amplifer 510 as it operates. Capacitor C1 is shown in phantom and represents the capacitance inherent in the PC board layout. In operation, each capacitance is selected to bypass a certain frequency spectrum of the noise generated by connection 515, whereby RF emission is minimized. For example, in a high speed conversion module or circuit 500 is implemented, the input signal to buffer amplifier 510 would be in the spectrum of frequency usage range.

Referring now to FIG. 16, there is shown a schematic diagram of the preferred physical layout of capacitors C2, C3 and C4 in a PC board according to the present invention. In FIG. 16, VCC is shown carried on a power plane 503, with the signal ground on a ground plane 505. Traces 507 and 508 run on a signal routing layer, and connect component 510 to the power plane 503 (optionally through an indicator 509) and ground plane 505, respectively. Where the multilayer noise suppression PC board construction technique disclosed in U.S. Pat. No. 4,751,613 is used, power plane 503 and ground plane 505 would sandwich the PC layer carrying traces 507 and 508. Nodes 520a and 520b, 521a and 521b and 522a and 522b represent the points where capacitors C2, C3 and C4 are physically connected to traces 507 and 508. The connection of trace 507 to the VCC power trace is accomplished at the end 525 of trace 507, while the connection of trace 508 to ground plane 505 is accomplished at the end 526 of trace 508. These connections go through the PC board to the respective layers 503 and 505.

For optimum bypass operation, it has been found that a physical location of nodes 520a and 520b, 521a and 521b, and 522a and 522b between component 510 and the VCC and ground plane connection traces 507 and 508 of a substantial impact on the effectiveness of the bypass operation. Accordingly, the present invention calls for physically locating nodes 520a, 521a and 522a between end 525 and component 510 along the path of trace 507, and nodes 520b, 521b and 522b between end 526 and component 510 along trace 508. Thus, noise which is bypassed by capacitors C2, C3 and C4 tends to loop back to the ground connection 511 of component 510 and not be transmitted to the VCC or ground planes 503 and 505, respectively. Moreover, it is preferable that the capacitors C2, C3 and C4 be arranged so that the one bypassing the highest frequency components be located in the innermost position. In FIG. 15, this is capacitor C2.

Thus, there has been described above various method and apparatus relating to the conversion of electrical to fiber optic signals. In particular, there has been described a front-rear modular conversion unit, a voice frequency mutliplexing circuit, a circuit for regulating loop current between a CO and a PBX emulator, and a method for minimizing high frequency noise radiation from a circuit board using bypass capacitors. Although these inventions have been described in their preferred form, those skilled in the art will readily recognize that many changes and modifications may be made thereto without departing from the spirit and the scope of the invention, as set forth in the claims appended hereto.

What is claimed is:

1. A method for connecting an integrated circuit component to the power supply and ground planes on a PC board and for bypassing high frequency noise generated by the circuit component comprising the steps of:
   providing a power supply trace on said PC board between the power lead of said component and said power supply plane;
   providing a signal ground trace on said PC board between the signal ground lead of said component and said ground plane;
   providing one or more bypass capacitors each having first and second leads; and
   connecting said first lead of each of said one or more bypass capacitors to said power supply trace between said power lead of said component and where said power supply trace connects to said power supply plane, and said second lead of each of said one or more bypass capacitors to said signal ground trace between said signal ground lead of said component and where said signal ground trace connects to said ground plane.

2. A method for connecting an integrated circuit component to the power supply and ground planes on a PC board and bypassing high frequency noise generated by said component, comprising the steps of:
   providing a PC board having a power and a signal ground plane;
   providing a component and mounting said component on said PC board, said component having a power lead and a signal ground lead;
   providing a first trace and connecting said first trace between said power lead of said component and said power supply plane on said PC board;
   providing a second trace and connecting said second trace between said signal ground lead of said component and said signal ground plane on said PC board;
   providing one or more capacitors, each having first and second leads, and connecting each said first capacitor lead to said first trace between said power lead of said component and the end of said first trace connected to said power supply plane, and connecting each said second capacitor lead to said second trace between said signal ground connection of said component and the end of said second trace connected to said signal ground plane.

3. A printed circuit assembly including apparatus for bypassing high frequency noise comprising:
   a printed circuit board having a power supply plane and a signal ground plane;

a circuit component mounted on said printed circuit board, said component having a power lead and a signal ground lead;

a first trace connected between said power lead of said component and said power supply plane on said printed circuit board;

a second trace connected between said signal ground lead of said component and said signal ground plane on said printed circuit board; and one or more capacitors, each having first and second leads;

said first capacitor lead of each capacitor connected to said first trace between said power lead of said component and where said first trace connects to said power supply plane, and said second capacitor lead of each capacitor connected to said second trace between said signal ground lead of said component and where said second trace connects to said signal ground plane.

4. Apparatus according to claim 3 wherein each of said one or more capacitors is of a different capacitance selected according to the spectrum of noise sought to be bypassed.

5. Apparatus according to claim 4 wherein said leads of said capacitor having the least capacitance are connected to said traces between said component leads and where the leads of said remaining one or more capacitors are connected to said traces.

6. An apparatus according to claim 5 wherein said first trace is connected to said power supply plane through a series connected inductor.

7. Apparatus for bypassing high frequency noise generated by a circuit component mounted to a PC board having power supply and signal ground planes, comprising:

a power supply trace connected to the power lead of said component on one end and on the other end to said power supply plane on said PC board;

a signal ground trace connected to the signal ground lead of said component on one end and on the other end to said signal ground plane on said PC board;

one or more bypassing capacitors, each having first and second leads; and connecting said first capacitor lead of each capacitor to said power supply trace between said power lead of said component and said other end of said power supply trace, and connecting said second capacitor lead of each capacitor to said signal ground trace between said signal ground lead of said component and said other end of said signal ground trace.

8. Apparatus according to claim 7 wherein each of said one or more capacitors is a different capacitance selected according to the spectrum of noise sought to be bypassed.

9. Apparatus according to claim 8 wherein capacitor having the least capacitance are connected to said traces between said component lead and where the leads of said remaining one or more capacitors are connected to said traces.

10. Apparatus according to claim 7 further wherein a series connected inductor is connected between said one end of said first trace and said power supply plane.

* * * * *

UNITED STATES PATENT AND TRADEMARK OFFICE
CERTIFICATE OF CORRECTION

PATENT NO. : 5,027,089

DATED : June 25, 1991

INVENTOR(S) : Reinhold Henke

It is certified that error appears in the above-identified patent and that said Letters Patent is hereby corrected as shown below:

In Column 2, line 25, delete "rear" and insert thereto --Rear--.

In Column 3, line 16, delete "standoff" and insert thereto --stand-off--.

In Column 7, line 55, after the word "into" insert thereto --four--.

In Column 9, line 3, delete "multilayered" and insert thereto --multi-layered--.

In Column 9, line 40, dete "multilayer" and insert thereto --multi-layer--.

In Column 9, line 57, delete"of" (first occurrence) and insert thereto --have --.

Signed and Sealed this

Third Day of August, 1993

Attest:

MICHAEL K. KIRK

*Attesting Officer*     *Acting Commissioner of Patents and Trademarks*